United States Patent
Shih et al.

(10) Patent No.: US 10,312,209 B2
(45) Date of Patent: *Jun. 4, 2019

(54) MANUFACTURING METHOD OF SEMICONDUCTOR PACKAGE

(71) Applicant: TAIWAN SEMICONDUCTOR MANUFACTURING COMPANY LTD., Hsinchu (TW)

(72) Inventors: Chao-Wen Shih, Hsinchu County (TW); Kai-Chiang Wu, Hsinchu (TW); Ching-Feng Yang, Taipei (TW); Ming-Kai Liu, Hsinchu (TW); Shih-Wei Liang, Taichung County (TW); Yen-Ping Wang, Changhua County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/951,930

(22) Filed: Apr. 12, 2018

(65) Prior Publication Data
US 2018/0233472 A1    Aug. 16, 2018

Related U.S. Application Data

(60) Continuation of application No. 15/348,929, filed on Nov. 10, 2016, now Pat. No. 9,953,942, which is a
(Continued)

(51) Int. Cl.
*H01L 23/48* (2006.01)
*H01L 23/00* (2006.01)
(Continued)

(52) U.S. Cl.
CPC .............. *H01L 24/11* (2013.01); *H01L 21/56* (2013.01); *H01L 21/565* (2013.01);
(Continued)

(58) Field of Classification Search
None
See application file for complete search history.

(56) References Cited

U.S. PATENT DOCUMENTS

| | | | |
|---|---|---|---|
| 9,953,942 B2 * | 4/2018 | Shih | H01L 24/11 |
| 2012/0139113 A1 * | 6/2012 | Arvin | H01L 24/11 |
| | | | 257/751 |

* cited by examiner

*Primary Examiner* — Ali Naraghi
(74) *Attorney, Agent, or Firm* — WPAT, P.C., Intellectual Property Attorneys; Anthony King

(57) ABSTRACT

The present disclosure provides a semiconductor package, which includes a substrate, a passivation layer, a post-passivation interconnect (PPI) having a top surface; and a conductive structure. The top surface of the PPI includes a first region receiving the conductive structure, and a second region surrounding the first region. The second region includes metal derivative transformed from materials made of the first region. The present disclosure provide a method of manufacturing a semiconductor package, including forming a first flux layer covering a portion of a top surface of a PPI; transforming a portion of the top surface of the PPI uncovered by the first flux layer into a metal derivative layer; removing the first flux layer; forming a second flux layer on the first region of the PPI; dropping a solder ball on the flux layer; and forming electrical connection between the solder ball and the PPI.

20 Claims, 25 Drawing Sheets

Related U.S. Application Data division of application No. 14/077,528, filed on Nov. 12, 2013, now Pat. No. 9,543,263.

(51) Int. Cl.
  *H01L 23/31* (2006.01)
  *H01L 23/29* (2006.01)
  *H01L 21/56* (2006.01)

(52) U.S. Cl.
  CPC ........ *H01L 23/291* (2013.01); *H01L 23/3157* (2013.01); *H01L 24/03* (2013.01); *H01L 24/05* (2013.01); *H01L 24/13* (2013.01); *H01L 23/3114* (2013.01); *H01L 2224/02175* (2013.01); *H01L 2224/03828* (2013.01); *H01L 2224/0401* (2013.01); *H01L 2224/05548* (2013.01); *H01L 2224/05624* (2013.01); *H01L 2224/05644* (2013.01); *H01L 2224/05647* (2013.01); *H01L 2224/05655* (2013.01); *H01L 2224/05684* (2013.01); *H01L 2224/10145* (2013.01); *H01L 2224/1134* (2013.01); *H01L 2224/11849* (2013.01); *H01L 2224/13007* (2013.01); *H01L 2224/13023* (2013.01); *H01L 2224/13111* (2013.01); *H01L 2224/13147* (2013.01); *H01L 2224/13155* (2013.01); *H01L 2224/81191* (2013.01); *H01L 2924/00014* (2013.01); *H01L 2924/01029* (2013.01); *H01L 2924/12042* (2013.01); *H01L 2924/181* (2013.01)

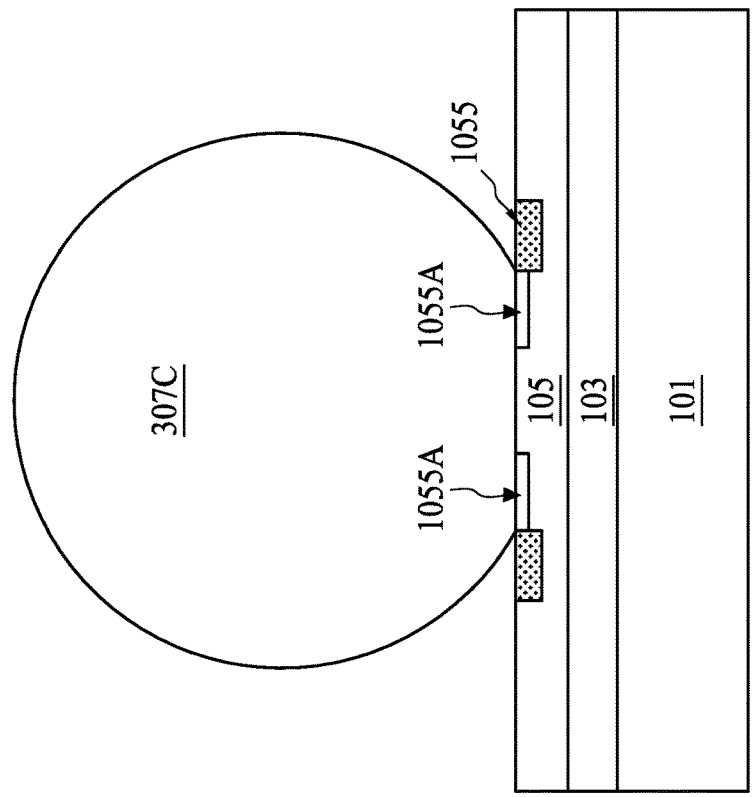
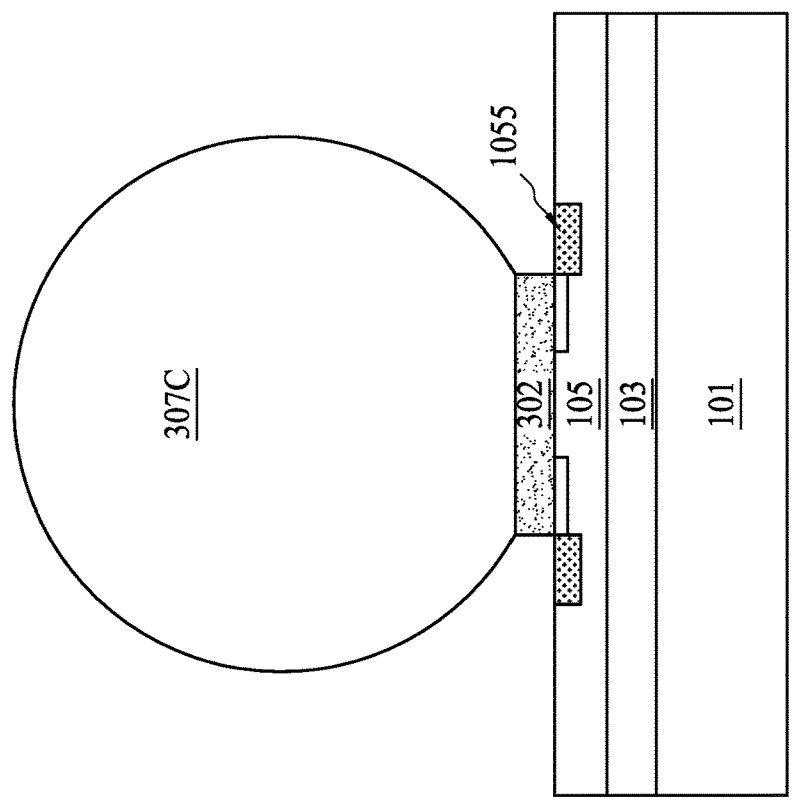
FIG. 9B
FIG. 9A

MANUFACTURING METHOD OF SEMICONDUCTOR PACKAGE

CROSS REFERENCE

This application claims the benefit of prior-filed U.S. patent application Ser. No. 14/077,528, filed Nov. 12, 2013, and Ser. No. 15/348,929, filed Nov. 10, 2016, under 35 U.S.C. 120.

FIELD

The present disclosure relates to a semiconductor packaging structure.

BACKGROUND

Wafer Level Packaging (WLP) refers to the technology of packaging an integrated circuit (IC) at a wafer level, instead of the traditional process of assembling the package of each individual die on individual packages. One feature of the WLP is that the resulting integrated circuit package is practically the same size as the individual package diced. Furthermore, WLP provides a streamlining of the semiconductor manufacturing process from start to customer shipment.

Soldering structures are well-adopted in WLP for external electrical connections. These range from hand-soldering methods to machine soldering methods. It is well-known to use a flux material with the soldering material. The flux material satisfies a number of functions. Generally a main function of the flux material is to ensure that conductive material of a first component, for example a support substrate such as a printed circuit board (PCB) interconnects well with good electrical conduction across the solder interconnect to a second component such as an electronic component.

To form a successful interconnection it is often necessary to apply a flux material. A number of different alternatives have been used. It is known for example to include a solid flux material within the soldering material. Generally such a soldering material would then be provided in a wire or other such solid form which would incorporate a core of flux material running through the solder. As the solder melts upon heating, the flux is activated, and the resulting interconnect formed if the soldering process is of an acceptable standard. It is also known to use solder paste materials. Solder pastes are generally homogenous, stable suspensions of solder particles in a flux medium material.

Reflow soldering is used in the automated manufacture of PCB's, wherein electronic components are surface mounted on PCB's to which a solder paste material has previously been applied by a method such as screen or stencil printing or dispensing. The PCB is then subjected to a sufficiently high temperature, to cause the solder to liquefy and to join the components in place on the PCB. The heat can be supplied by, for example, infrared, heated conveyor belt or convective means.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 9A and FIG. 9B are cross sectional views of a portion of a semiconductor package prepared by the manufacturing method described herein according to some embodiments of the present disclosure.

DETAILED DESCRIPTION OF THE INVENTION

Figure 1:
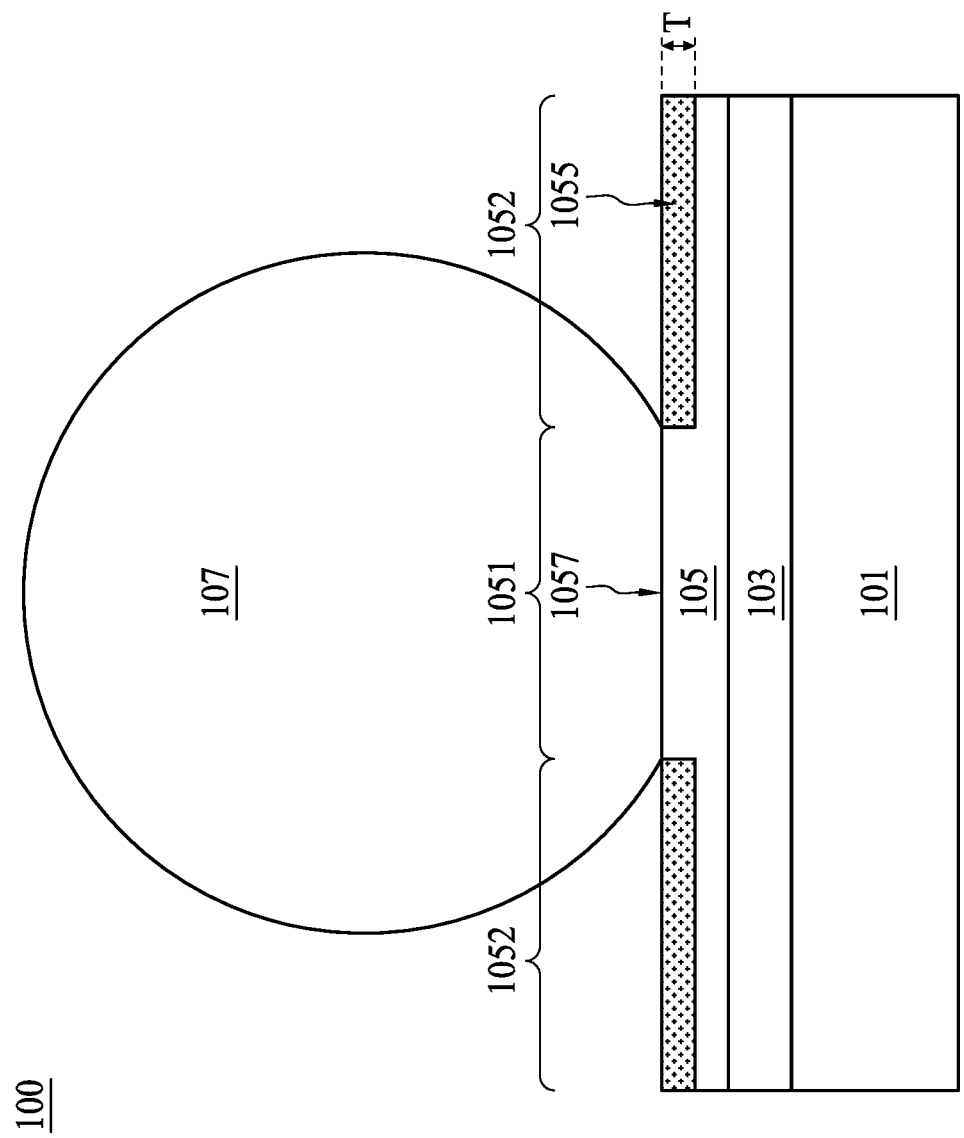
FIG. 1 is a cross sectional view of a portion of a semiconductor package according to some embodiments of the present disclosure.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Conventional four-L (4L) solder ball mount operation includes four lithography operations, namely a first lithography for a first dielectric layer, a second lithography for a post-passivation interconnect (PPI) layer, a third lithography for a second dielectric layer or a passivation layer, and a fourth lithography for a under bump metallization (UBM) layer. After the formation of the UBM layer, a conductive bump or a solder ball is disposed thereon to complete an external connection structure.

In the above-mentioned 4L external connection structure, a pattern of the second dielectric layer and the UBM create a concave structure to accommodate the subsequent conductive bump or the solder ball. Under this circumstance, the position of the conductive bump or the solder ball is confined within an area formed by the UBM even after a reflow operation. However, the manufacturing cost for the 4L external connection structure exceeds the alternative 2L external connection structure, and hence the current trend appears to adopt the 2L external connection structure in which only a first dielectric layer and a PPI layer is used.

In the 2L external connection structure, lack of the solder ball confinement causes ball shift and proliferate problems such as low packaging yield and low reliability. Ball shift phenomenon causes the electrical path to be cutoff and the contamination of the adjacent electrical trace distribution. Moreover, a minor ball shift can result a mechanically weak spot at a triple interface between the solder ball, the molding compound, and the ambient or underfill. Said weak spot easily produces crack which is inclined to propagate across the solder ball.

Some solutions are provided to resolve the ball shift problem in a 2L setting. For example, a recess is first formed in a PPI layer in order to accommodate the solder ball. Nevertheless, not only the additional patterning of the PPI layer produces extra cost, the ball shift problems remain to damage the reliability of the packaged devices. Some embodiments of the present disclosure provide a semiconductor package structure under a 2L setting, wherein a surface treatment is utilized to spatially confine the solder all disposed on the PPI. A portion of the surface of the PPI is transformed into metal derivative regions thereby avoid the contamination of the solder ball, and hence the spatial confinement of the solder ball is achieved. Some embodiments of the present disclosure also provide methods for manufacturing the semiconductor package structure under a 2L setting.

In describing and claiming the present disclosure, the following terminology will be used in accordance with the definitions set forth below.

As used herein, "flux" refers to substances facilitating soldering processes. In some embodiments, the flux contains reducing agent such as charcoal. In some embodiments, the flux contains corrosive materials. In some embodiments, the flux reduces surface tension of the molten solder and causes it to flow and wet a work piece more easily. In some embodiments, the flux is rosin-based.

As used herein, "vapor deposition" refers to process of depositing materials on a substrate using a vapor phase of a material to be deposited or a precursor of the material. Vapor deposition processes include any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like.

As used herein, "molding compound" refers to a compound formed with composite materials. A molding compound may include epoxy resins, phenolic hardeners, silicas, catalysts, pigments, mold release agents, or the like. Material for forming a molding compound has a high thermal conductivity, a low moisture absorption rate, a high flexural strength at board-mounting temperatures, or a combination thereof.

As used herein, "electrical interconnects" refers to conductive lines or films routed inside the IC structure over and around the die or dies. In some embodiments, the electrical interconnects are redistribution layers (RDL). The RDLs are used for a fan-in or a fan-out process. In some embodiments, the electrical interconnects are formed with a conductive material such as gold, silver, copper, nickel, tungsten, aluminum, and/or alloys thereof.

As used herein, a "patterning" or "patterned" is used in the present disclosure to describe an operation of forming a predetermined pattern on a surface. The patterning operation includes various steps and processes and varies in accordance with features of embodiments. In some embodiments, a patterning operation patterns an existing film or layer. The patterning operation includes forming a mask on the existing film or layer and removing the unmasked portion of the film or layer with an etch or other removal process. The mask is a photo resist or a hardmask. In some embodiments, a patterning operation directly forms a patterned layer on a surface. The patterning operation includes forming a photosensitive film on the surface, conducting a photolithography process and a developing process. The remaining photosensitive film may be removed or retained and integrated into the package.

The problems and needs outlined above may be addressed by embodiments of the present disclosure. FIG. 1 is a cross sectional view of a portion of a semiconductor package 100 in a 2L setting. A device substrate 101 includes a semiconductor substrate, such as a silicon wafer, a silicon die, a semiconductor-on-insulator (SOI) substrate, or any construction comprising semiconductor materials. Semiconductor devices, such as transistors, capacitors, resistors, diodes, photo-diodes, fuses, and the like, interconnected to perform one or more functions is formed at a surface of the substrate 101. A dielectric layer or a passivation layer 103 is disposed on the substrate 101 to provide electrical insulation of the electrical connection from the substrate 101 at some predetermined region. In some embodiments, the passivation layer 103 is formed of a non-organic material selected from un-doped silicate glass (USG), silicon nitride, silicon oxynitride, silicon oxide, and combinations thereof. In another embodiment, the passivation layer 103 is formed of a polymer layer, such as an epoxy, polyimide, benzocyclobutene (BCB), polybenzoxazole (PBO), and the like, although other relatively soft, often organic, dielectric materials can also be used.

Referring to FIG. 1, a PPI layer 105 is disposed on the passivation layer 103. In some embodiments, the PPI layer 105 is formed of a conductive material including, but not limited to, for example copper, aluminum, copper alloy, nickel, or other mobile conductive materials. In other embodiments, the PPI layer 105 electrically connects semiconductor devices in the substrate 101 to a subsequently-formed conductive structure 107. The PPI layer 105 also function as a power line, re-distribution line (RDL), inductor, capacitor, or any passive component. In some embodiments, the PPI layer 105 has a thickness less than about 30 µm, for example between about 2 µm and about 25 µm. In other embodiments the PPI layer 105 has a top surface 1057 at the side opposite to the passivation layer 103. The conductive structure 107 is electrically coupled to the PPI layer 105 by connecting to the top surface 1057 of the PPI layer 105.

In some embodiments, the top surface 1057 of the PPI layer 105 includes a first region 1051 electrically connected to the conducive structure 107, and a second region 1052 surrounding the first region 1051, not electrically connected to the conductive structure 107. The feature distinguishing the first region 1051 and the second region 1052 is that the second region 1052 includes a metal derivative layer at the top surface 1057 of the PPI layer 105, whereas no metal derivative layer is positioned within the first region 1051. The wetting property of the second region 1052 is termed with respect to the conductive structure 107, which is often metallic material, and the unwetted property of the second region 1052 is caused by a metal derivative 1055 positioned therein. Considering the surface energy of the metal derivative 1055 and the surface energy of the conductive structure 107, the contact between both the metal derivative 1055 and the conductive structure 107 interface exert a repelling force on each other. In other words, a contact angle (not shown) of the conductive structure 107 to the metal derivative 1055 is as least greater than 90 degrees, demonstrating a low wetting capability.

In some embodiments, the conductive structure 107 includes a copper layer, a copper alloy layer, a nickel layer, a nickel alloy layer, a solder layer, or combinations thereof. The solder layer in the conductive structure 107 may include a lead-free pre-solder layer, SnAg, or a solder material including alloys of tin, lead, silver, copper, nickel, bismuth, or combinations thereof. In certain embodiments, the conductive structure 107 is a solder ball or a solder paste. For example, the use of lead in solder composition has come under scrutiny and has become undesirable for environmental and health reasons. As a result, in some embodiments, the solder ball is to eliminate the requirement for lead from solder compositions. Such lead-free solder compositions typically include tin, copper and silver (typically 95.5% by weight tin, 4% by weight silver and 0.5% by weight copper). Bismuth may also be used together with tin, antimony and silver in a range of approximately 1.0% to 4.5% by weight.

Referring to FIG. 1, although not shown in the final product as demonstrated in the semiconductor package structure 100, a flux material is predisposed between the conductive structure 107 and the first region 1051 of the PPI layer 105 before a reflow operation. It has been generally recognized that providing a flux material which achieves a number of functions is desirable. In particular it is desirable that the flux material provides good surface activation. In this respect, it has been known to include an activator component within the flux material which will act to remove oxidized material from a metal surface, thereby allowing better solder to metal interconnection. In some embodiments, activators are added to decompose and remove any oxide film existing in the portion where soldering is going to be carried out, and are usually organic compounds containing halides, typically amine hydrohalides, such as diethylamine hydrochloride or weak halide-free organic acids.

In some embodiments, the metal derivative 1055 possess a thickness T from about 1 µm to about 3 µm. Said thickness T range exceeds a thickness (not shown) of the native oxide or nitride at the top surface 1057 of the PPI layer 105, depending in which ambient environment the packaging operations are carried out. In some embodiments, the PPI layer 105 is formed of a conductive material including, but not limited to, copper, aluminum, copper alloy, nickel, or other mobile conductive materials, and the packaging operation is conducted in an oxygen-containing environment, the metal derivative 1055 include conductive material oxides. In other embodiments, the PPI layer 105 is formed of a conductive material and the packaging operation is conducted in a nitrogen-containing environment, the metal derivative 1055 include conductive material nitrides.

Figure 2A:
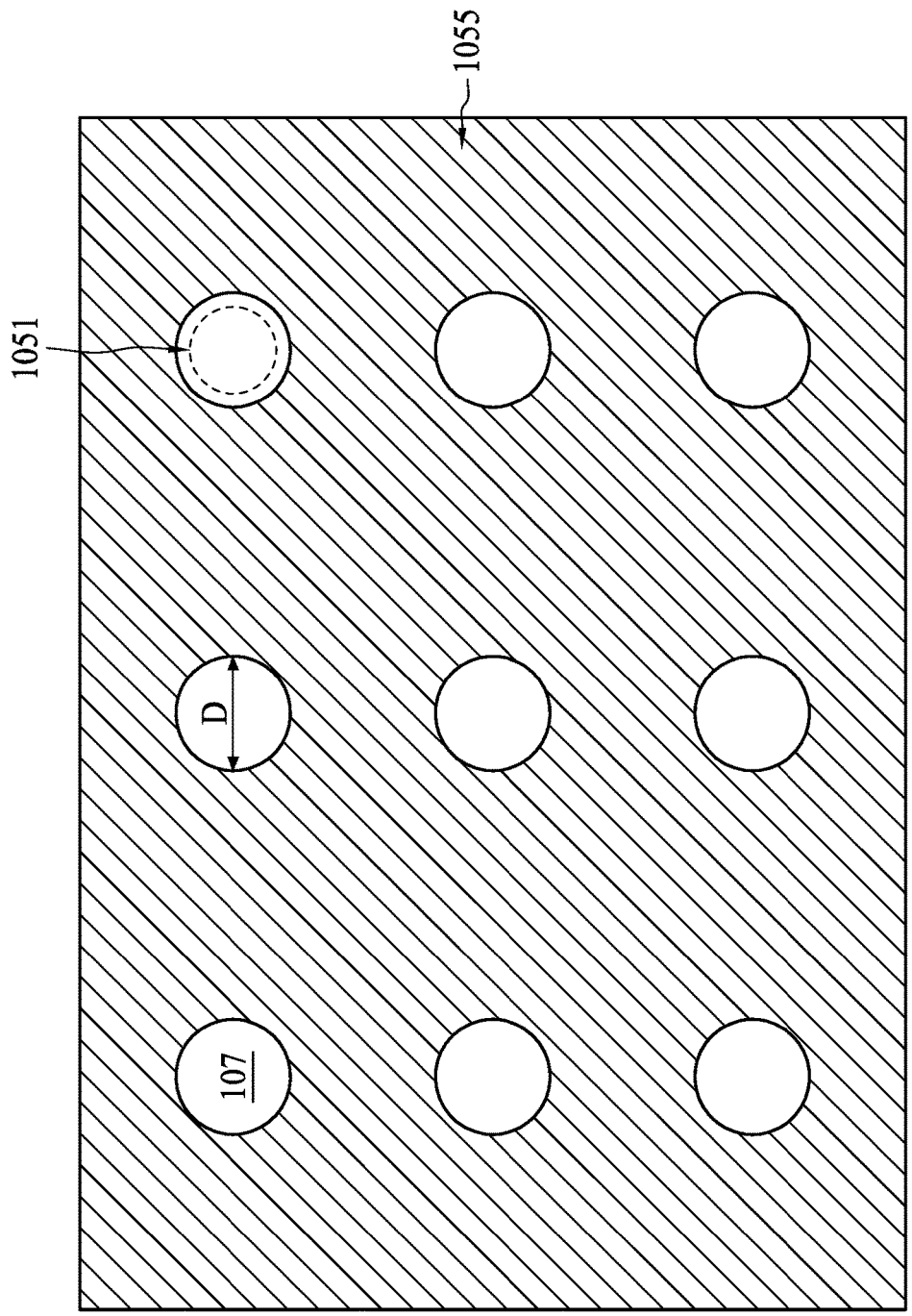
FIG. 2A is a top view of a portion of a semiconductor package according to some embodiments of the present disclosure.

Referring to FIG. 2A, FIG. 2A is a top view of the semiconductor package structure 100 shown in FIG. 1 according to some embodiments of the present disclosure. Elements sharing the same labeling numerals as those in the FIG. 1 are referred thereto and are not repeated here for simplicity. In FIG. 2A, only the conductive structure 107 and the metal derivative 1055 are shown from a top view perspective, and the underlying PPI layer 105, the passivation layer 103, and the substrate 101 shown in FIG. 1 are covered by the conductive structure 107 and the metal derivative 1055. In some embodiments, because the conductive structure 107 is a solder ball, a circular area having a diameter D of the solder ball appears to be greater than an area of the first region 1051 (shown in dotted line) at the surface 1057 of the PPI layer 105. Area other than the first region 1051 is the second region 1052 defined by the metal derivative 1055. In other embodiments, the contour of the first region 1051 is not limited to a circular shape as shown in FIG. 2A, other contours such as a square, a quadrilateral shape, or shapes with irregular boundaries are within the contemplated scope of the present disclosure.

Figure 2B:
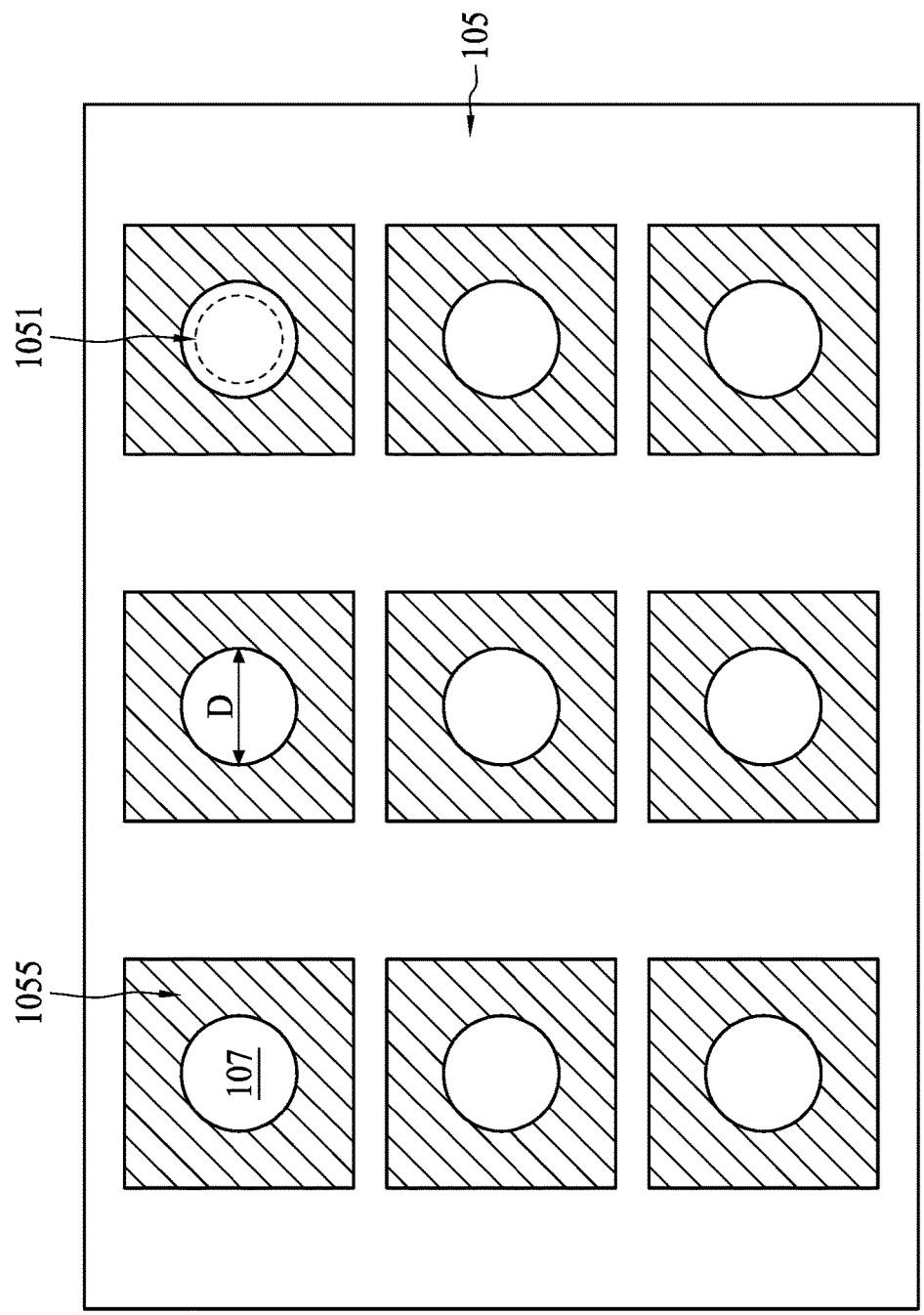
FIG. 2B is a top view of a portion of a semiconductor package according to some embodiments of the present disclosure.

Referring to FIG. 2B, FIG. 2B is a top view of the semiconductor package structure 100 shown in FIG. 1 according to some embodiments of the present disclosure. Elements sharing the same labeling numerals as those in the FIG. 1 are referred thereto and are not repeated here for simplicity. In FIG. 2B, the conductive structure 107, the metal derivative 1055, and the PPI layer 105 are shown from a top view perspective, and the underlying passivation layer 103 as well as the substrate 101 shown in FIG. 1 are covered by the conductive structure 107, the metal derivative 1055, and the PPI layer 105. Considering the metal derivative 1055 is non electrical conductive and thereby increasing the resistance of the PPI layer 1055, the second region 1052 defined by the metal derivative 1055 is shrinked to a smaller area surrounding the first region 1051 compared to that shown in FIG. 2A. In other embodiments, the contour of the metal derivative 1055 is not limited to a square shape as shown in FIG. 2B, other contours such as a circle, a quadrilateral shape, or shapes with irregular boundaries are within the contemplated scope of the present disclosure. In still other embodiments, the contour of the metal derivative 1055 is not limited to a solid shape as shown in FIG. 2B, a discontinuous pattern such as a radiation pattern or spiral pattern of the metal derivative 1055 are within the contemplated scope of the present disclosure.

Figure 3A:
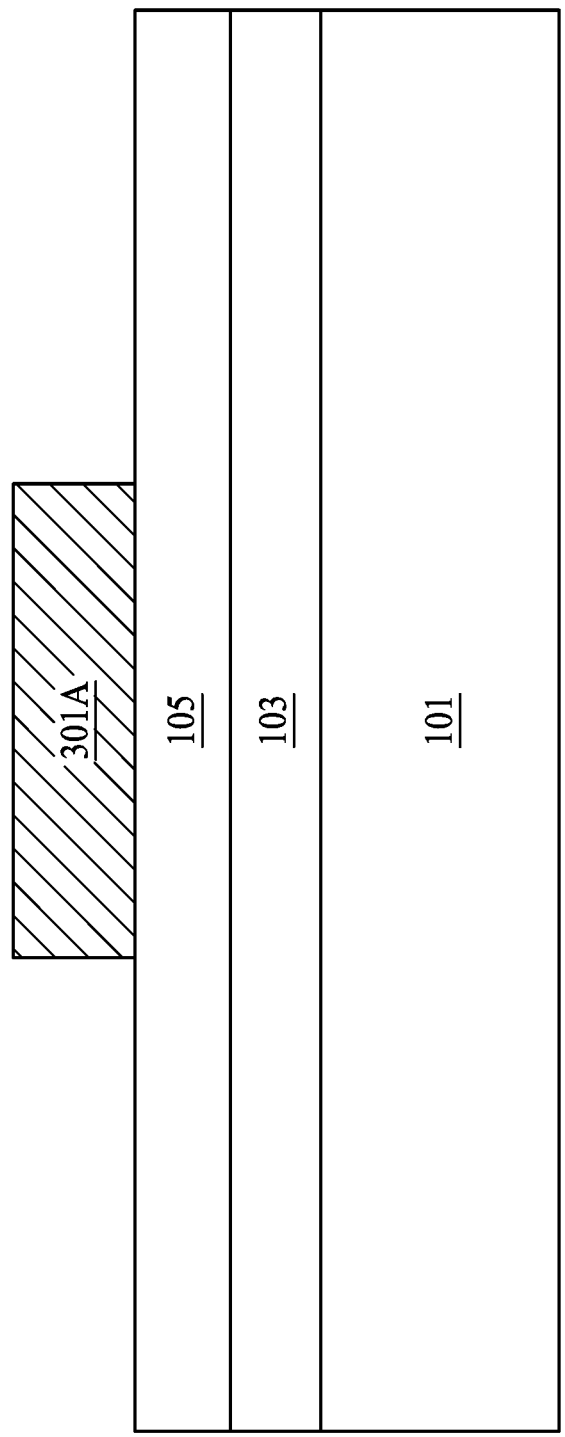
FIG. 3A to FIG. 3C is a cross sectional view of a portion of semiconductor packages prepared by the manufacturing methods described herein according to some embodiments of the present disclosure.

FIG. 3A to FIG. 9B show operations of a method for manufacturing a semiconductor package. Three alternatives are discussed in FIG. 3A to FIG. 9B, that is, operations for three embodiments are shown in FIG. 3A to FIG. 9B. A first operation is described using FIG. 3A, FIG. 4A, FIG. 5A, FIG. 6A, FIG. 7A, and FIG. 7B; a second operation is described using FIG. 3B, FIG. 4B, FIG. 5B, FIG. 6B, FIG. 8A, and FIG. 8B; and a third operation is described using FIG. 3C, FIG. 4C, FIG. 5C, FIG. 6C, FIG. 9A, and FIG. 9B. Referring to FIG. 3A, a hard mask layer 301A is positioned over a stack shown in FIG. 1 of the present disclosure. The stack includes a substrate 101, a passivation layer 103, and a PPI layer 105. In FIG. 3A, a photoresist 301A is patterned on the upmost PPI layer 105 to shelter a portion of the PPI 105. However, in other embodiments, a dielectric layer is used to shelter the portion of the PPI 105. The dielectric material including silicon nitride, silicon carbide, silicon carbonitride, silicon oxycarbide, tetra-ethyl-ortho-silicate (TEOS) oxide, silicon oxide, multi-layers thereof and/or combinations thereof by PECVD techniques or high-density plasma CVD (HDPCVD), or the like.

Figure 3B:
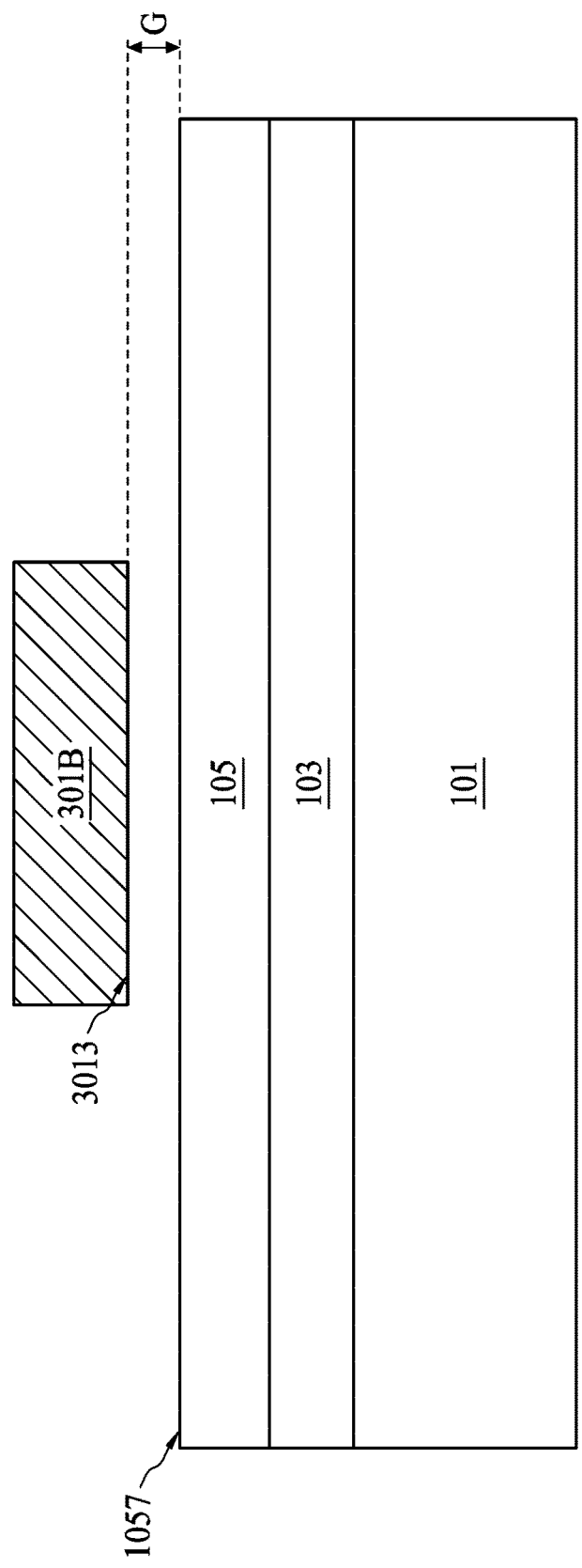

Referring to FIG. 3B, a hard mask layer 301B is positioned over a stack (101, 103, 105) shown in FIG. 1 of the present disclosure. In some embodiments, the hard mask layer 301B is utilized to obtain a semiconductor package structure as shown in FIG. 2A, in which the metal derivative 1055 is blanket formed surrounding the first region 1051. In some embodiments, the hard mask layer 301B is a first stencil plate positioned over the PPI layer 105 to shelter a portion of the PPI 105. In certain embodiments, a gap G between a bottom surface 3013 of the hard mask layer 301B and the top surface 1057 of the PPI layer 105 is less than 10 μm.

Figure 3C:
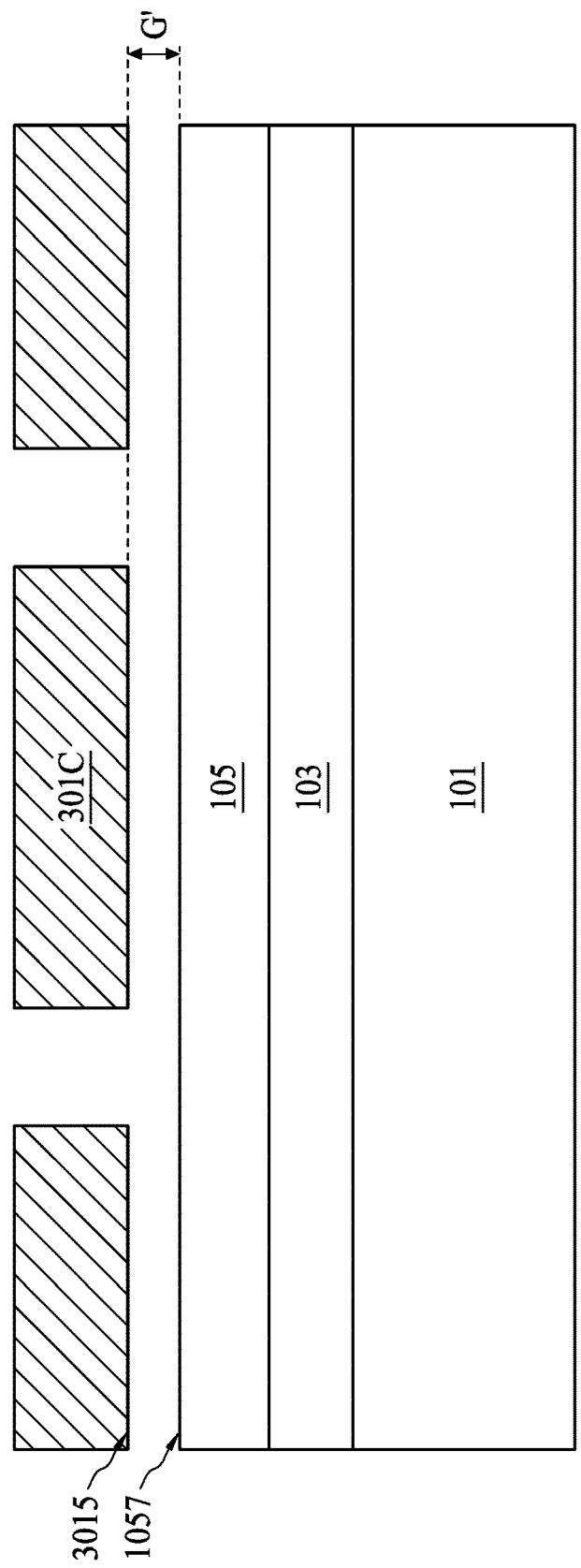

Referring to FIG. 3C, a hard mask layer 301C is positioned over a stack (101, 103, 105) shown in FIG. 1 of the present disclosure. In some embodiments, the hard mask layer 301C is utilized to obtain a semiconductor package structure as shown in FIG. 2B, in which the metal derivative 1055 is formed only at specific regions surrounding the first region 1051. In some embodiments, the hard mask layer 301C is a first stencil plate positioned over the PPI layer 105 to shelter a portion of the PPI 105. In certain embodiments, a gap G' between a bottom surface of the hard mask layer 301C and the top surface 1057 of the PPI layer 105 is less than 10 μm. However, in other embodiments, a coating layer (not shown) is formed at the bottom surface 3015 of the hard mask layer 301C, and said coating layer is thick enough to contact the top surface 1057 of the PPI layer 105. As such, the gap G' is eliminated if a first bottom-coated stencil plate is used as a hard mask layer 301C. In some embodiments, the coating layer is a diamond-like carbon film, and the first stencil plate is formed of stainless steel.

Figure 4A:
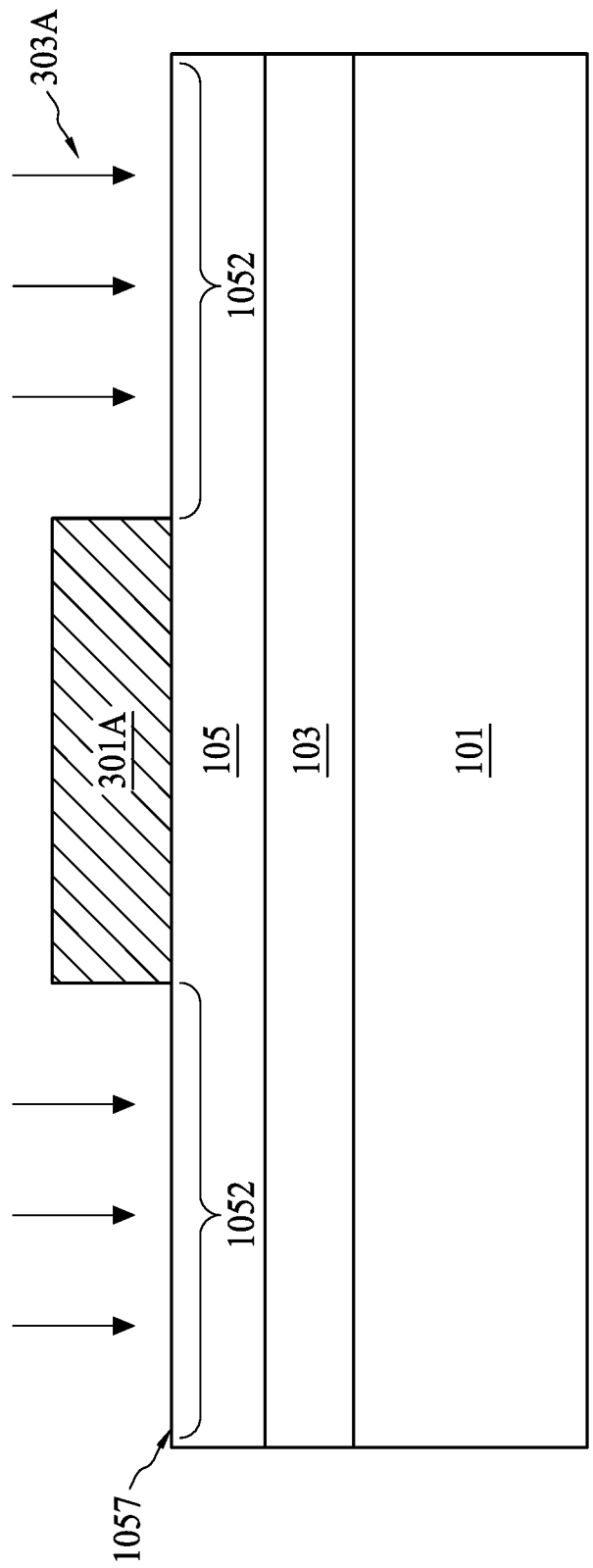
FIG. 4A to FIG. 4C are cross sectional views of a portion of semiconductor packages prepared by the manufacturing methods described herein according to some embodiments of the present disclosure.
Figure 5A:
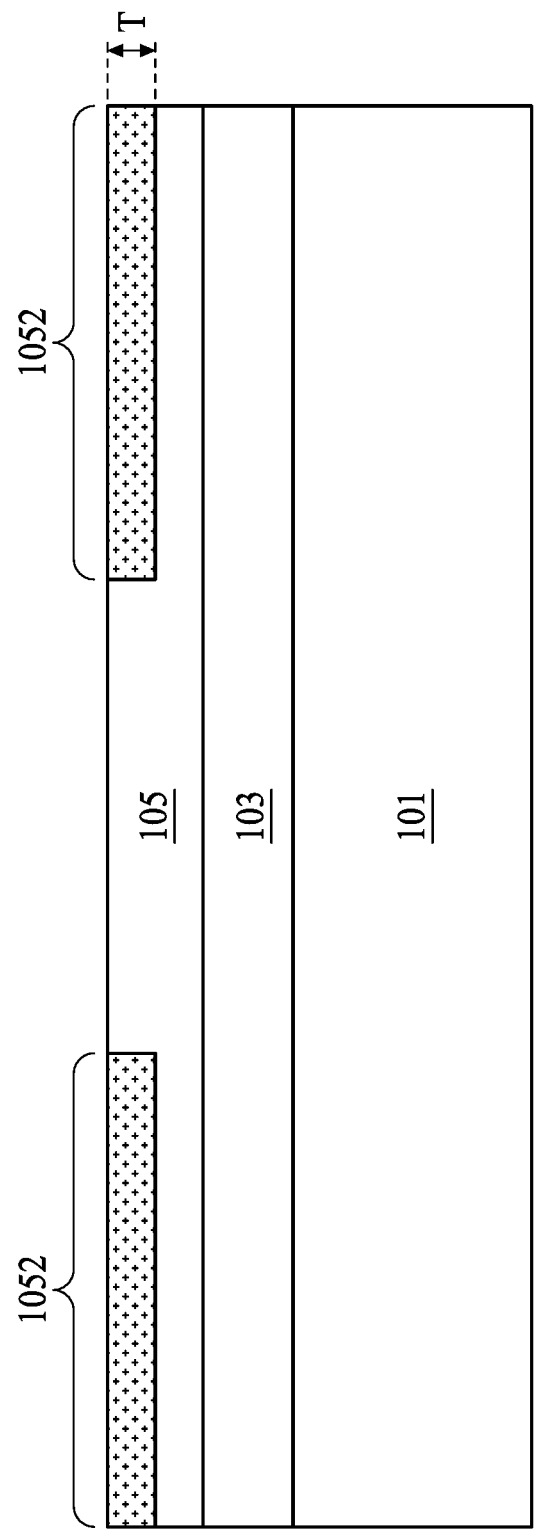
FIG. 5A to FIG. 5C are cross sectional views of a portion of semiconductor packages prepared by the manufacturing methods described herein according to some embodiments of the present disclosure.

Referring to FIG. 4A and FIG. 5A, a surface treatment operation is adopted to form a metal derivative 1055 in a second region 1052 of the PPI layer 105. In some embodiments, the metal derivative 1055 is formed at a near-surface region not covered by the hard mask layer 301A that is positioned on the top surface 1057 of the PPI layer 105, and said near-surface region is the second region 1052. For example, oxygen plasma 303A is adopted to convert the second region 1052 from conductive materials to conductive material oxides. In some embodiments, the oxygen plasma 301A source is not limited to a low frequency plasma sources. Other plasma sources such as radio frequency (RF) plasma source, microwave (MW) remote plasma source, direct current (DC) plasma source, inductively coupled plasma source (ICP), electron cyclotron resonance plasma source (ECR), and other types of plasma equipment and processes can be employed as well. Through routine experimentation, one skilled in the art can select proper plasma equipment and conditions, such as plasma power, processing time, oxygen flow, and pressure in the chamber, required to convert the desired thicknesses of the conductive materials into conductive material oxides by oxygen plasma conversion as described herein.

In some embodiments as shown in FIG. 4A, the oxygen plasma 303A is generated in a reactive-ion-etch system with a power density of from about 0.1 W/cm$^2$ to about 0.6 W/cm$^2$ and an RF frequency of from about 1 MHz to about 60 MHz. The oxygen flow is about from 6 to 180 SCCM, and the oxygen partial pressure is about from 1 to 25 mTorr. About from 15 to 300 seconds of process time was sufficient to render the near-surface region of the PPI layer 105 into conductive material oxides with a desired thickness T of about 1.5 μm as shown in FIG. 5A.

Figure 4B:
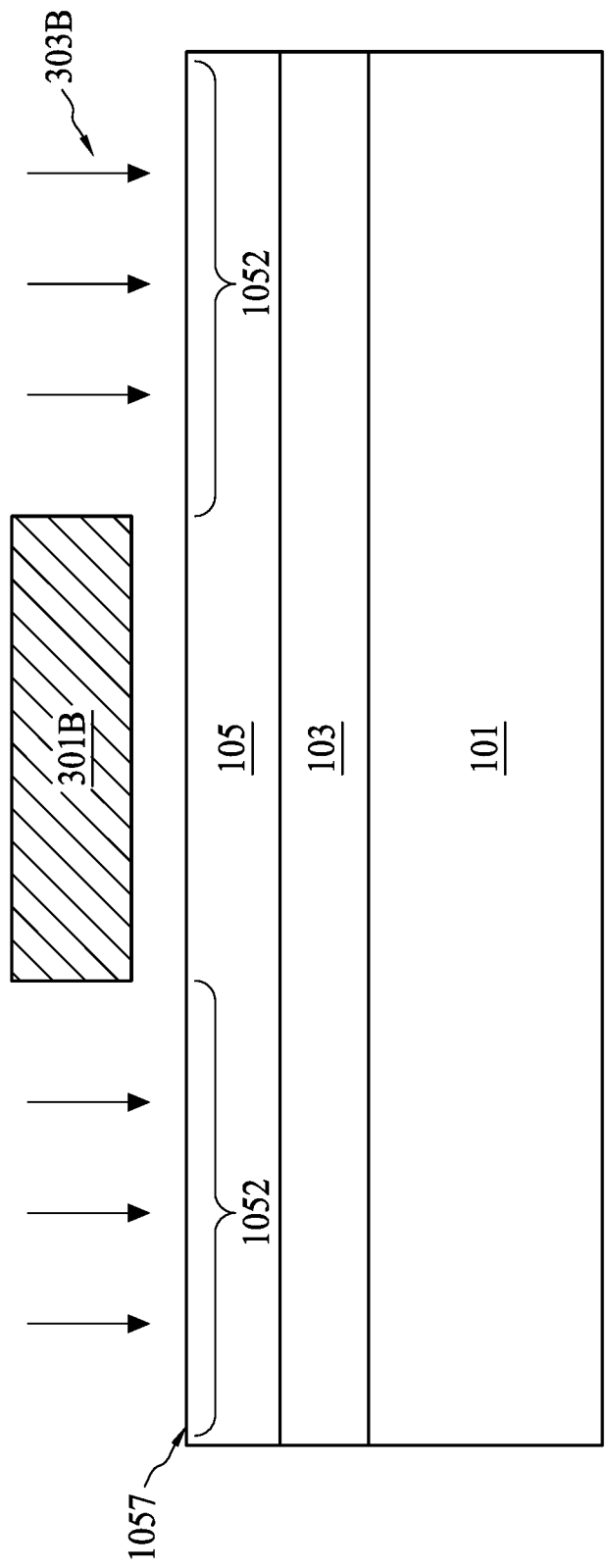
Figure 5B:
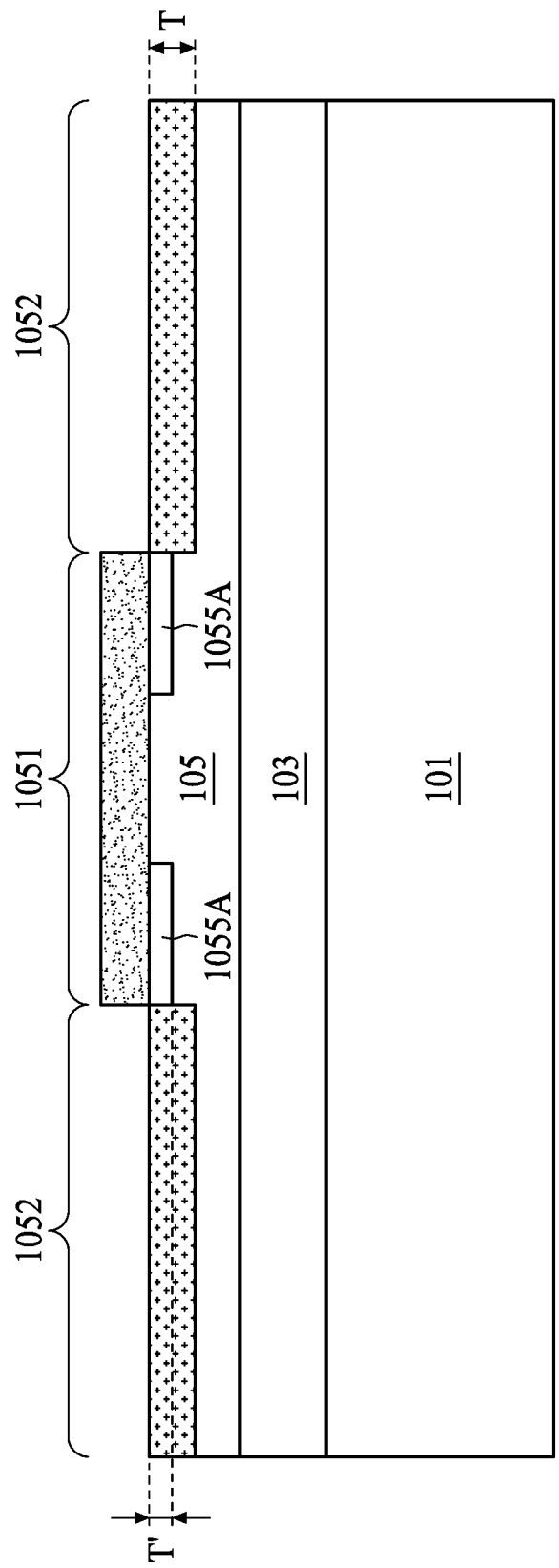

Referring to FIG. 4B and FIG. 5B, a surface treatment operation is adopted to pattern a metal derivative 1055 in a second region 1052 of the PPI layer 105. In some embodiments, the metal derivative 1055 is formed at a near-surface region not covered by the hard mask layer 301B that is positioned over the top surface 1057 of the PPI layer 105, and said near-surface region is the second region 1052. For example, oxygen plasma 303B is adopted to convert the second region 1052 from conductive materials to conductive material oxides. As shown in FIG. 5B, the metal derivative 1055 is formed at the second region 1052 as well as at a portion of the first region. In some embodiments, because the hard mask layer 301B in FIG. 4B is a stencil plate that is not physically contacting the top surface 1057 of the PPI layer 105, the oxygen plasma 303B is then reacting with a portion of the first region 1051 and forming a metal derivative region 1055A therein. In certain embodiments, a thickness T' of the metal derivative region 1055A is from about 0.1 time to about 0.5 time of the thickness T of the metal derivative 1055. Oxygen plasma 303B adopted in FIG. 4B is previously recited in the present disclosure referring to the description of FIG. 4A and is not repeated here for simplicity.

In some embodiments as shown in FIG. 4B, the oxygen plasma 303A is generated in a reactive-ion-etch system with a power density of about from 0.1 to 0.6 W/cm$^2$ and an RF frequency of from about 1 MHz to about 60 MHz. The oxygen flow is about from 6 to 180 SCCM, and the oxygen partial pressure is about from 1 to 25 mTorr. About from 15 to 300 seconds of process time was sufficient to render the near-surface region of the PPI layer 105 into conductive material oxides with a desired thickness T of about 1.8 μm as shown in FIG. 5B.

Figure 4C:
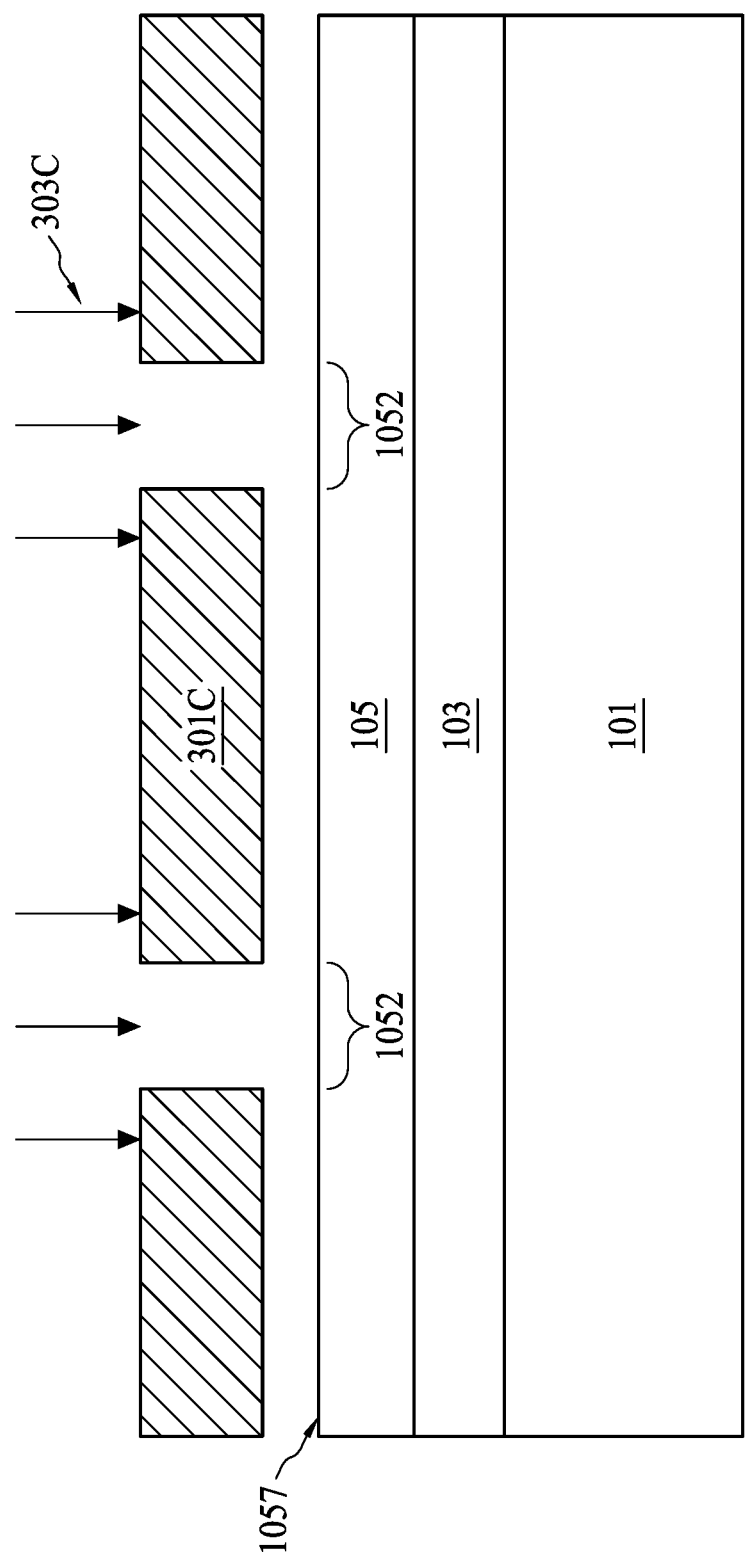
Figure 5C:
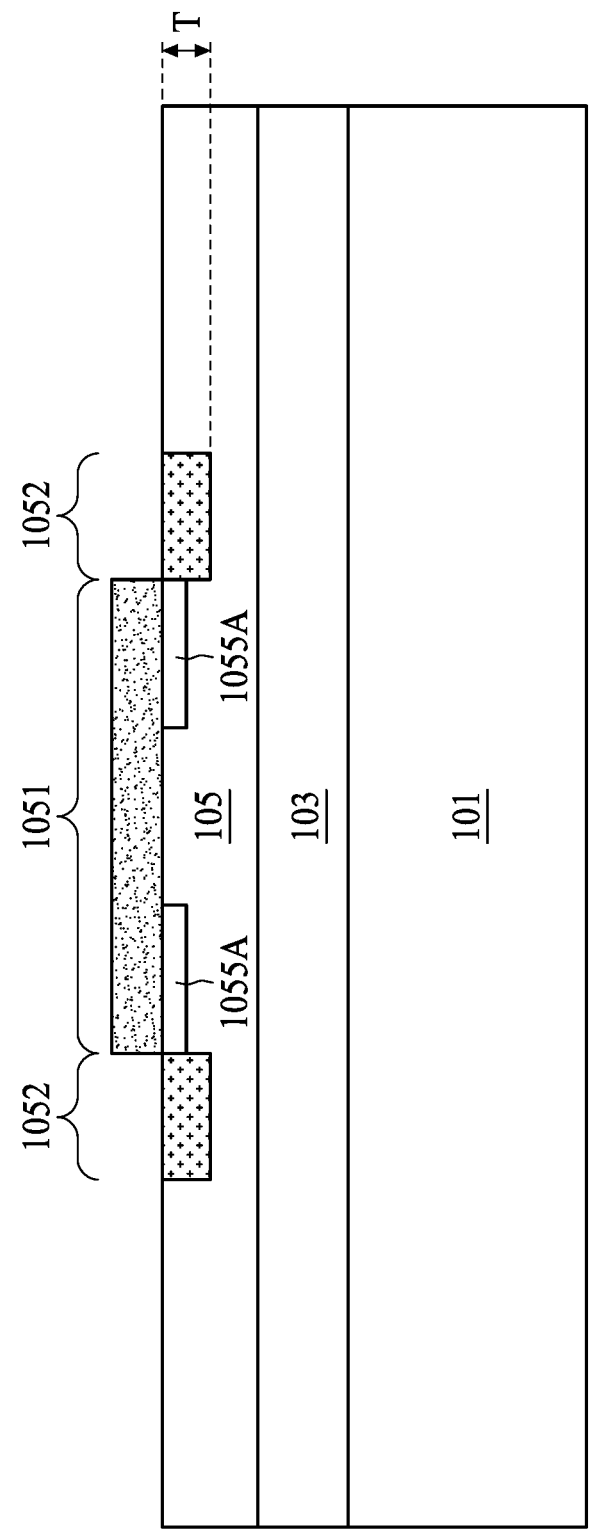

Referring to FIG. 4C and FIG. 5C, a surface treatment operation is adopted to pattern a metal derivative 1055 in a second region 1052 of the PPI layer 105. In some embodiments, the metal derivative 1055 is formed at a near-surface region not covered by the hard mask layer 301C that is positioned over the top surface 1057 of the PPI layer 105, and said near-surface region is the second region 1052. For example, oxygen plasma 303C is adopted to convert the second region 1052 from conductive materials to conductive material oxides. As shown in FIG. 5C, the metal derivative 1055 is formed at the second region 1052 as well as at a portion of the first region.

Referring to FIG. 4C and FIG. 5C, in some embodiments, because the hard mask layer 301C is a stencil plate that is not physically contacting the top surface 1057 of the PPI layer 105, the oxygen plasma 303C is then reacting with a portion of the first region 1051 and forming an metal derivative region 1055A therein. In certain embodiments, a thickness T of the metal derivative region 1055A is from about 0.1 time to about 0.5 time of the thickness T of the metal derivative 1055. Oxygen plasma 303C adopted in FIG. 4C is previously recited in the present disclosure referring to the description of FIG. 4A and is not repeated here for simplicity.

Still in FIG. 4C and FIG. 5C, in some embodiments, because the hard mask layer 301C is a bottom-coated stencil plate (not shown) that is physically contacting the top surface 1057 of the PPI layer 105, the oxygen plasma 303C is then blocked from the first region 1051 and no metal derivative region 1055A is formed therein (not illustrated in FIG. 5C). In other words, only the metal derivative 1055 in the second region 1052 but the metal derivative region 1055A in the first region is formed on the near-surface region of the PPI layer 105.

In some embodiments as shown in FIG. 4C, the oxygen plasma 303C is generated in a reactive-ion-etch system with a power density of from about 0.1 to about 0.6 W/cm$^2$ and an RF frequency of about from 1 MHz to about 60 MHz. The oxygen flow is about from 6 to 180 SCCM, and the oxygen partial pressure is about from 1 to 25 mTorr. About from 15 to 300 seconds of process time is sufficient to render the near-surface region of the PPI layer 105 into conductive material oxides with a desired thickness T of about 2 μm as shown in FIG. 5C.

Figure 6A:
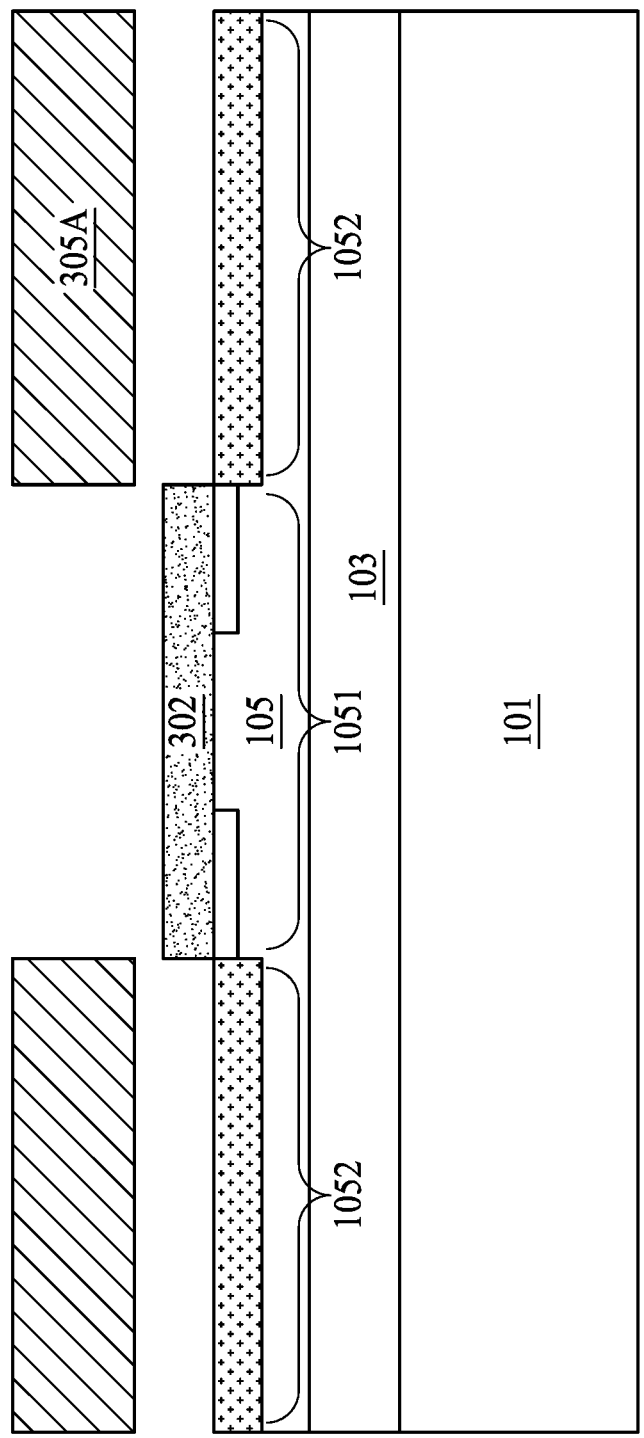
FIG. 6A to FIG. 6C are cross sectional views of a portion of semiconductor packages prepared by the manufacturing methods described herein according to some embodiments of the present disclosure.
Figure 6B:
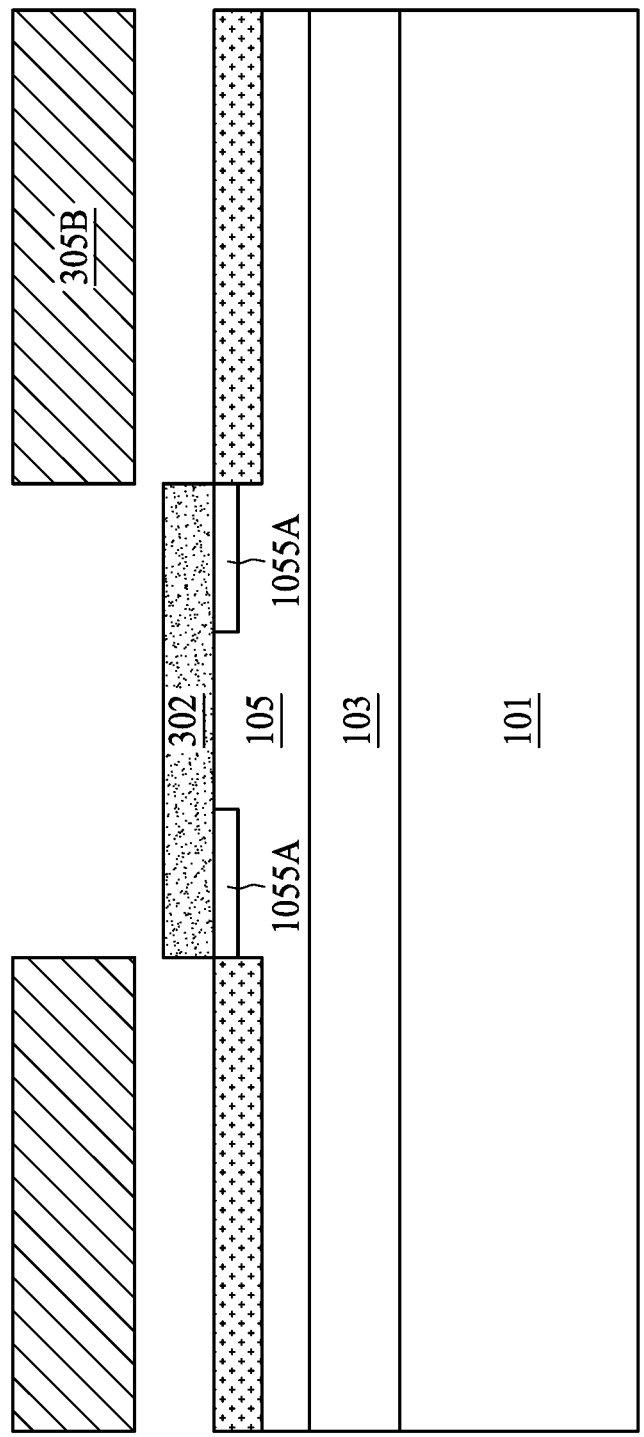
Figure 6C:
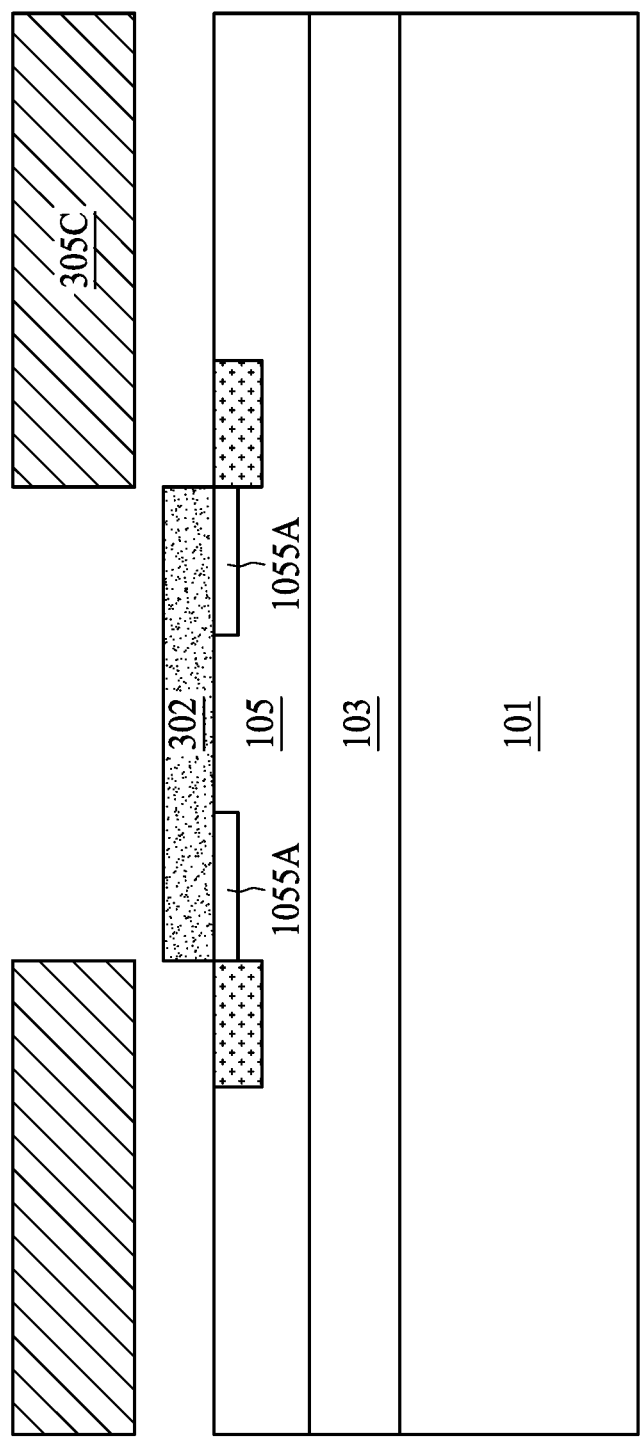

Referring to FIG. 6A, FIG. 6B, and FIG. 6C, a flux layer 302 is formed on the first region 1051 of the PPI layer 105 by a patterning operation. In some embodiments as shown in FIG. 6A to FIG. 6C, a second stencil plate (305A, 305B, 305C) is placed over the PPI layer 105 and sheltering the second region 1052 thereof. A squeegee (not shown) is then spreading the flux material into the openings of the second stencil plate (305A, 305B, 305C) to form the flux layer 302. In certain embodiments, the second stencil plate (305A, 305B, 305C) is not limited to be located above the top surface 1057 of the PPI layer 105, but rather is directly placed on the top surface 1057 of the PPI layer 105. In other embodiments, the second stencil plate (305A, 305B, 305C) is a bottom-coated stencil plate which is physically in contact with the top surface 1057 of the PPI layer 105. The structure and the materials of the bottom-coated stencil plate is previously recited in the present disclosure referring to the description in FIG. 3C and is not repeated here for simplicity.

Figure 7B:
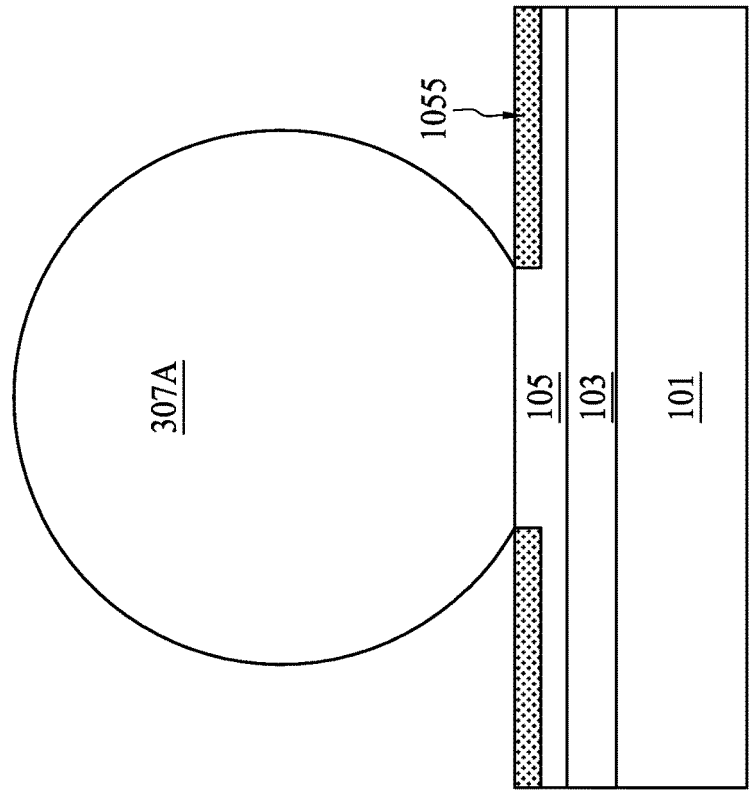
FIG. 7A and FIG. 7B are cross sectional views of a portion of a semiconductor package prepared by the manufacturing method described herein according to some embodiments of the present disclosure.
Figure 7A:
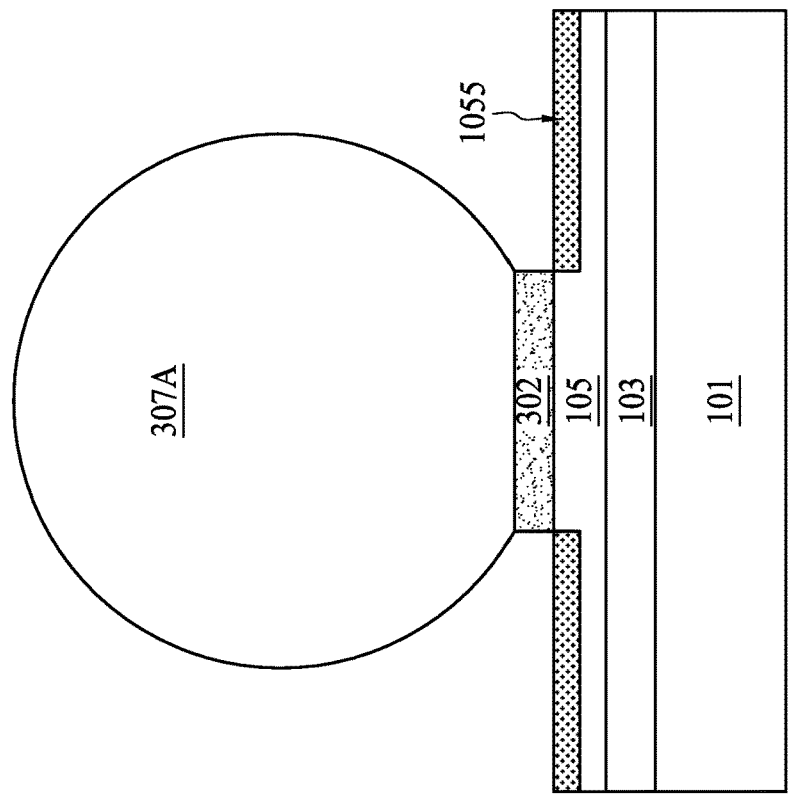

FIG. 7A to FIG. 9B show a solder ball-dropping operation and a subsequent reflowing operation in some embodiments provided in the present disclosure. Elements sharing the same labeling numerals as those in the FIG. 1 are referred thereto and are not repeated here for simplicity. FIG. 7A shows a conductive structure 307A such as a solder ball being placed on the flux layer 302 following the operations shown in FIG. 3A, FIG. 4A, FIG. 5A, and FIG. 6A. FIG. 7B shows a final structure after a reflow operation conducted on the semiconductor package structure in FIG. 7A. In some embodiments the reflow operation includes heating the semiconductor package structure to a temperature of about 250 degrees Celsius and keep at said temperature for 2 minutes. After the reflow operation is completed, the flux layer 302 disappears and the conductive structure 307A is electrically connected to the PPI layer 105.

Figure 8B:
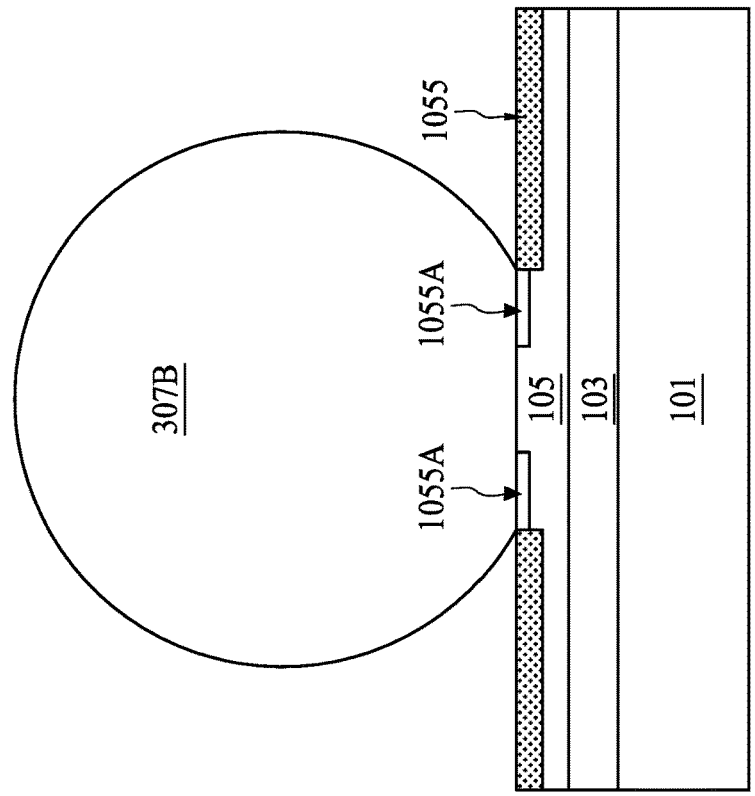
FIG. 8A and FIG. 8B are cross sectional views of a portion of a semiconductor package prepared by the manufacturing method described herein according to some embodiments of the present disclosure.
Figure 8A:
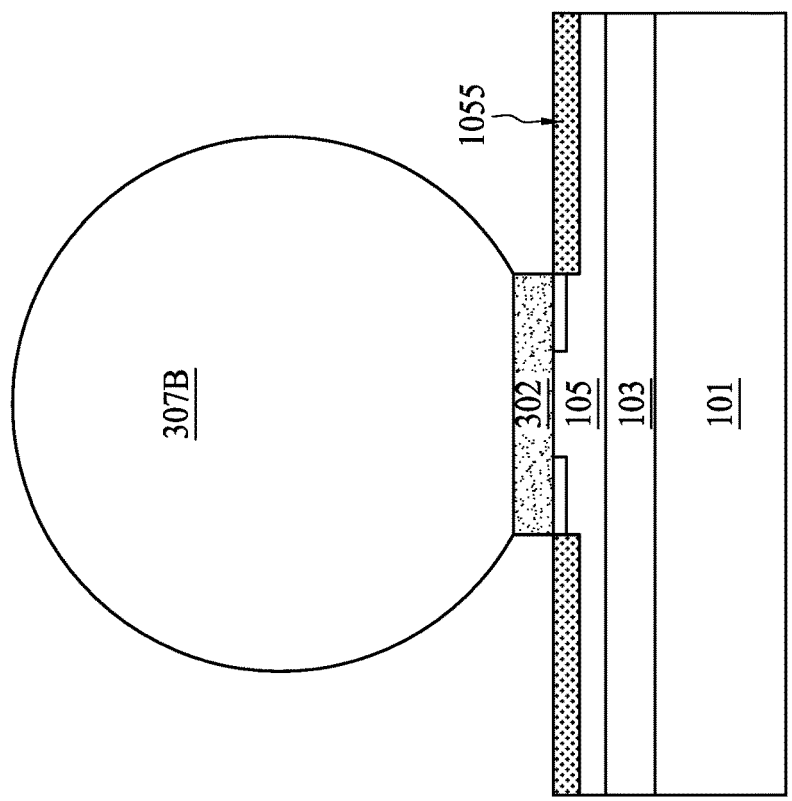

FIG. 8A shows a conductive structure 307B such as a solder ball being placed on the flux layer 302 following the operations shown in FIG. 3B, FIG. 4B, FIG. 5B, and FIG. 6B. FIG. 8B shows a final structure after a reflow operation conducted on the semiconductor package structure in FIG. 8A. In some embodiments the reflow operation includes heating the semiconductor package structure to a temperature of about 230 degrees Celsius and keep at said temperature for 1.5 minutes. After the reflow operation is completed, the flux layer 302 disappears and the conductive structure 307B is electrically connected to the PPI layer 105.

FIG. 9A shows a conductive structure 307C such as a solder ball being placed on the flux layer 302 following the operations shown in FIG. 3C, FIG. 4C, FIG. 5C, and FIG. 6C. FIG. 9B shows a final structure after a reflow operation conducted on the semiconductor package structure in FIG. 9A. In some embodiments the reflow operation includes heating the semiconductor package structure to a temperature of about 260 degrees Celsius and keep at said temperature for 1 minute. After the reflow operation is completed, the flux layer 302 disappears and the conductive structure 307C is electrically connected to the PPI layer 105.

Figure 10:
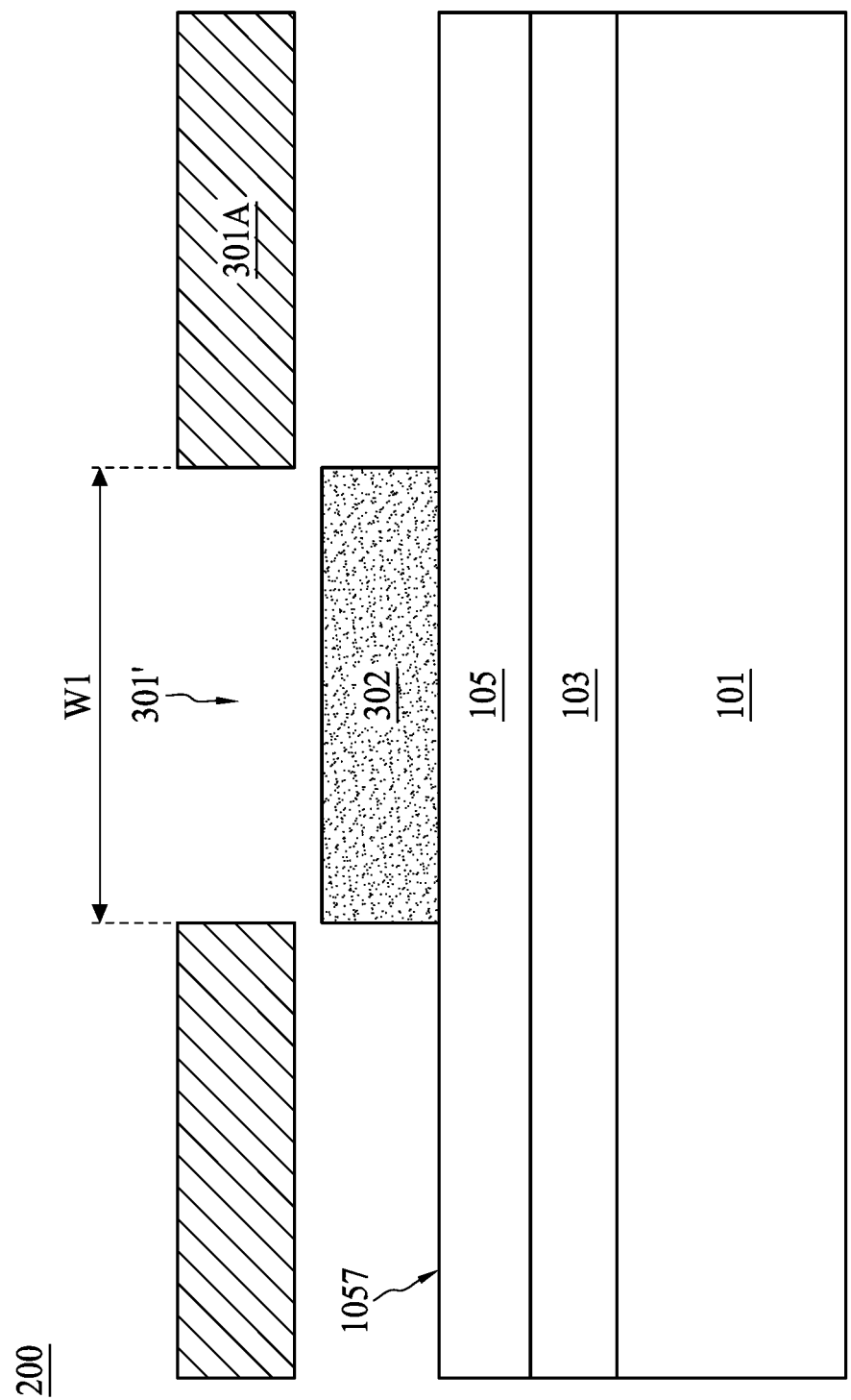
FIG. 10 to FIG. 16 are cross sectional views of a portion of semiconductor packages prepared by the manufacturing methods described herein according to some embodiments of the present disclosure.

FIG. 10 to FIG. 15 show a method for manufacturing a semiconductor package 200 according to some embodiments of the present disclosure. Elements sharing the same labeling numerals as those in previous figures are referred thereto and are not repeated here for simplicity. Referring to FIG. 10, a first flux layer 302 is formed on the top surface 1057 of the PPI layer 105. In some embodiments, the first flux layer 302 is formed using a first stencil plate 301A. As shown in FIG. 10, an opening 301' of the first stencil plate 301A has a width W1 which allows the flux paste to be positioned on the underlying top surface 1057 when a squeegee (not shown) spreading the flux paste across the opening 301'. In other embodiments, the pattering of the first flux layer 302 is carried out by a screen printing operation or a photolithography operation using either photoresist or a hard mask layer.

Referring to FIG. 1, a portion of the top surface 1057 of the PPI layer 105 that is uncovered by the first flux layer 302 is transformed into an unwetted layer composed of metal derivative 1055 such as conductive material oxides or nitrides. In some embodiments, the semiconductor package 200A is positioned in an oxygen-containing environment and is subject to a first temperature heat treatment. For example, the first temperature is of form about 100 to about 250 degrees Celsius, and the oxygen gas in the oxygen-containing environment reacts with the near-surface region of the PPI layer 105 for a duration of about 10 minutes to form a layer of metal derivative 1055. In some embodiments, the oxidation operation includes flowing oxygen gas into a chamber accommodating the semiconductor package 200A at a flow rate of 50 SCCM and at a temperature within the range of the first temperature. In some embodiments, the metal derivative 1055 possess a thickness T of about 1 μm.

Figure 11:
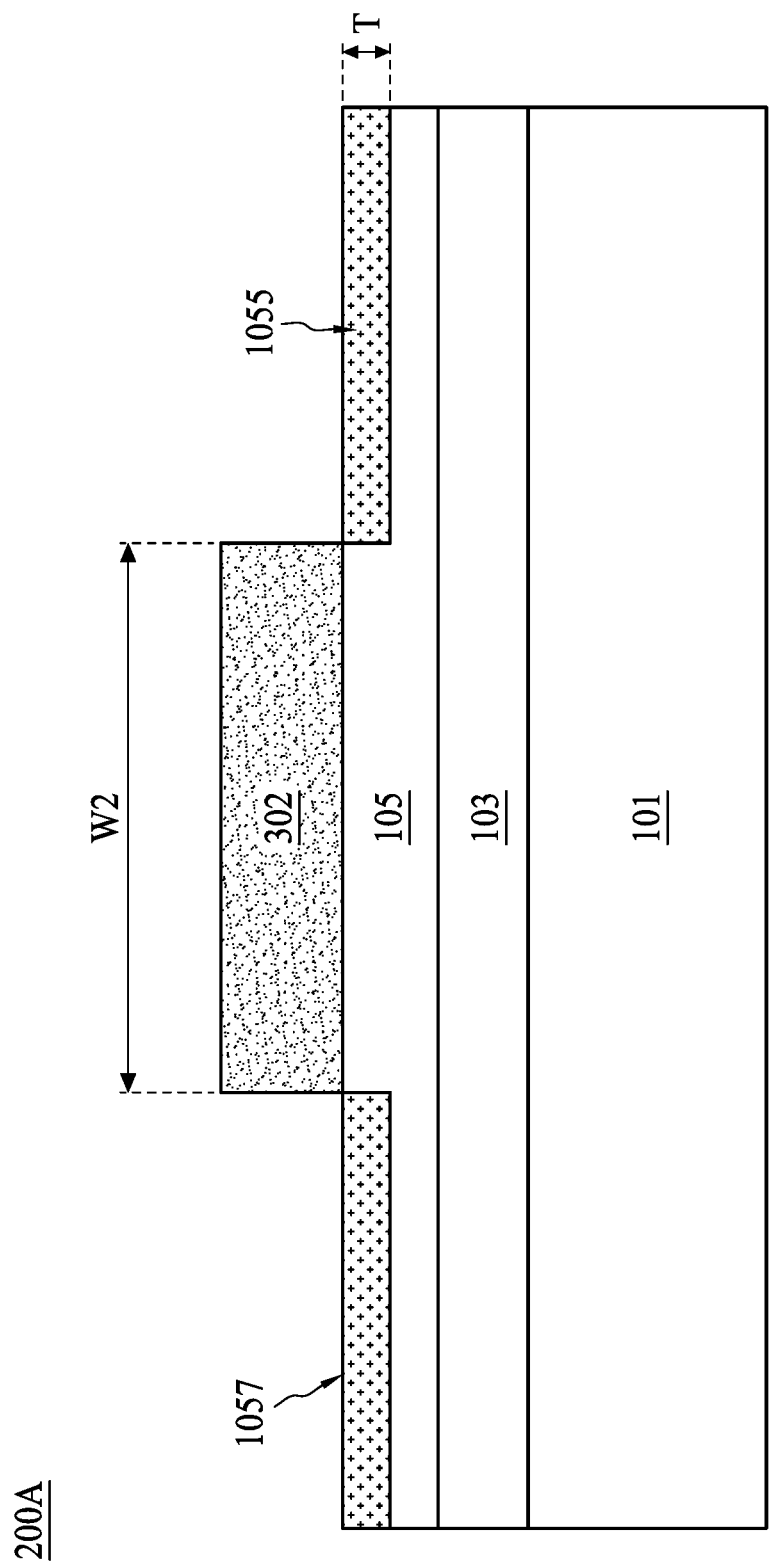

However, in other embodiments, the semiconductor package 200A is subject to an oxygen plasma treatment in an RIE chamber and the temperature in said chamber is controlled at a first temperature. For example, the first temperature is of form about 150 to about 200 degrees Celsius. In some embodiments, oxygen plasma treatment adopted in FIG. 11 is previously recited in the present disclosure referring to the description of FIG. 4A and is not repeated here for simplicity. In some embodiments as shown in FIG. 11, oxygen plasma is generated in an RIE system with a power density of from about 0.1 to about 0.6 W/cm² and an RF frequency of from about 1 MHz to about 60 MHz. The oxygen flow rate is about 6 to 180 SCCM, and the oxygen partial pressure is from about 1 to about 25 mTorr. About from 15 to 300 seconds of process time under the first temperature is sufficient to render the near-surface region of the PPI layer 105 into conductive material oxides with a desired thickness T. In other embodiments, oxygen plasma treatment is conducted without controlling an RIE chamber temperature at the first temperature.

As shown in FIG. 10 and FIG. 11, a width of the flux layer 302 transforms from a width W1 to a width W2 when the metal derivative 1055 is formed on the top surface 1057 of the PPI layer 105. In some embodiments, the width W2 is greater than the width W1. For example, the flux layer 302 is composed of rosin which is a mixture of organic acids (resin acids, predominantly abietic acid, with pimaric acid, isopimaric acid, neoabietic acid, dihydroabietic acid, and dehydroabietic acid). The flux layer 302 turns liquid, ionic and mildly reactive to metal oxides at molten state. The flux layer 302 tends to soften when it is subject to the first temperature (form about 150 to about 200 degrees Celsius) and is able to dissolve thinner layers of surface oxides from copper without further additives. Hence, the width W2 of the flux layer 302 in FIG. 11 is greater than the width W1 of the flux layer 302 in FIG. 10 is because of the softening phenomenon of the rosin when it is subject to a temperature greater than 70 degrees Celsius.

Figure 12:
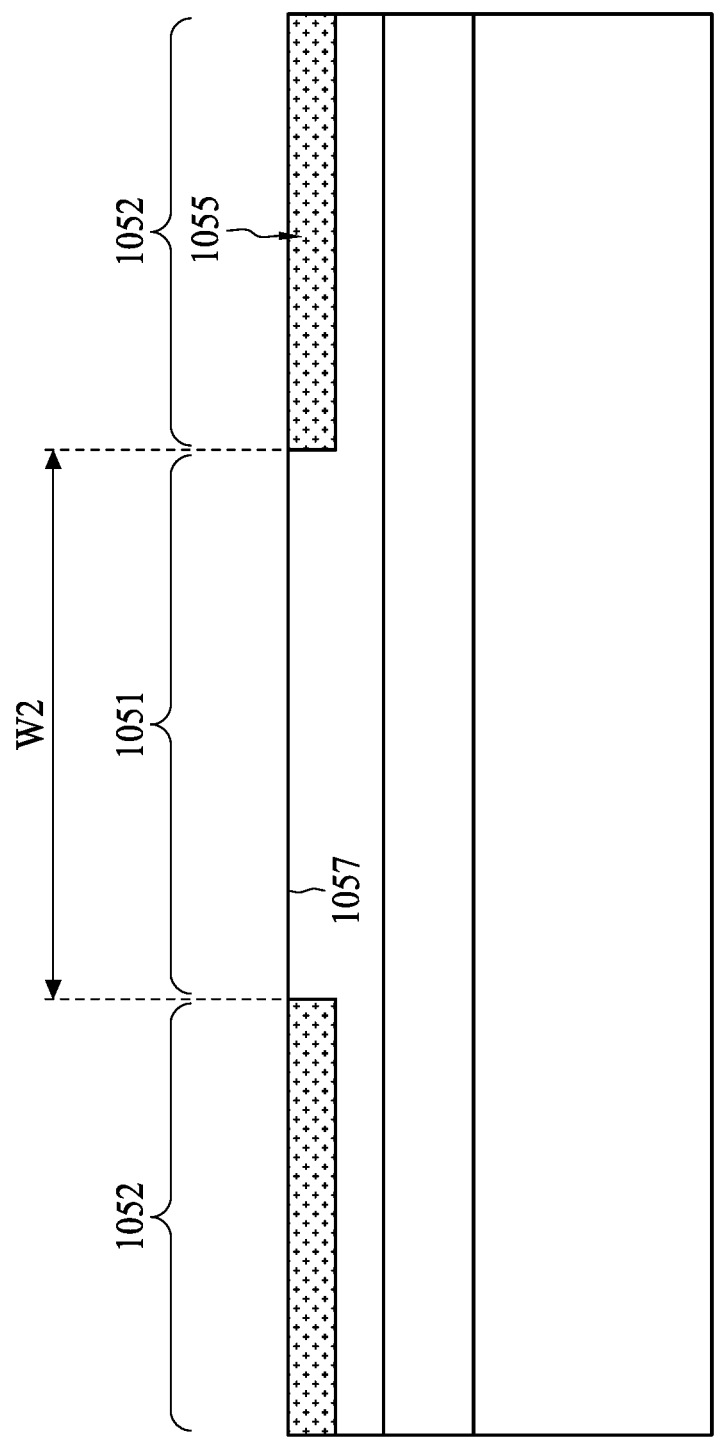

Referring to FIG. 11 and FIG. 12, the first flux layer 302 is removed and a first region 1051 on the top surface 1057 of the PPI layer 105 is exposed. In some embodiments, the first flux layer 302 is removed by flux remover such as halogen-free organic solvent, amine-based compounds, or chelating agent having no amino group, and water in a basic environment. Compared to the width W1 of the first flux layer 302 shown in FIG. 10, the width W2 of the first region 1051 in FIG. 12 reflects a dimension of the first flux layer 302 after the first temperature treatment as shown in FIG. 1, and hence, the width W2 of the first region 1051 is greater than the width W1 of the first flux layer 302 shown in FIG. 10. In some embodiments, an area of the first region 1051 is greater than an area covered by the first flux layer 302 in FIG. 10 before transforming the portion of the top surface of the PPI uncovered by the first flux layer into metal derivative 1055.

Figure 13:
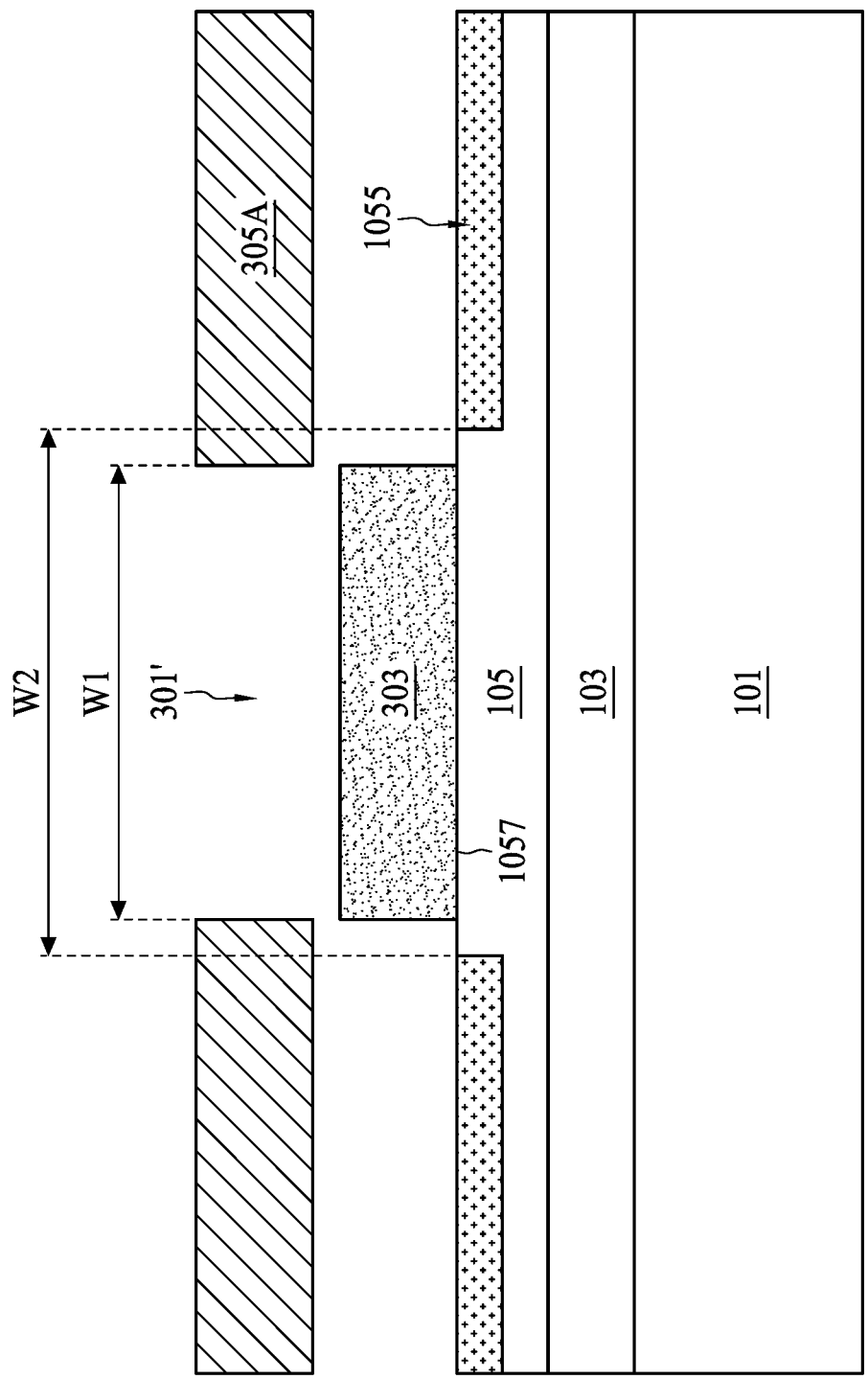

Referring to FIG. 13, a second flux layer 303 having a width W1 is formed on the top surface 1057 of the PPI layer 105. In some embodiments, the second flux layer 303 is formed using a second stencil plate 305A. As shown in FIG. 13, an opening 301' of the second stencil plate 305A has a width W1 which allows the flux paste to be positioned on the underlying top surface 1057 when a squeegee (not shown) spreading the flux paste across the opening 301'. In other embodiments, the patterning of the second flux layer 303 is carried out by a screen printing operation or a photolithography operation using either photoresist or a hard mask layer. In some embodiments, the width W2 of the first region 1051 is greater than the width W1 of the second flux layer 303. However, in other embodiments, the width W1 of the second flux layer 303 can be equal to the width W2 of the first region 1051.

Figure 14:
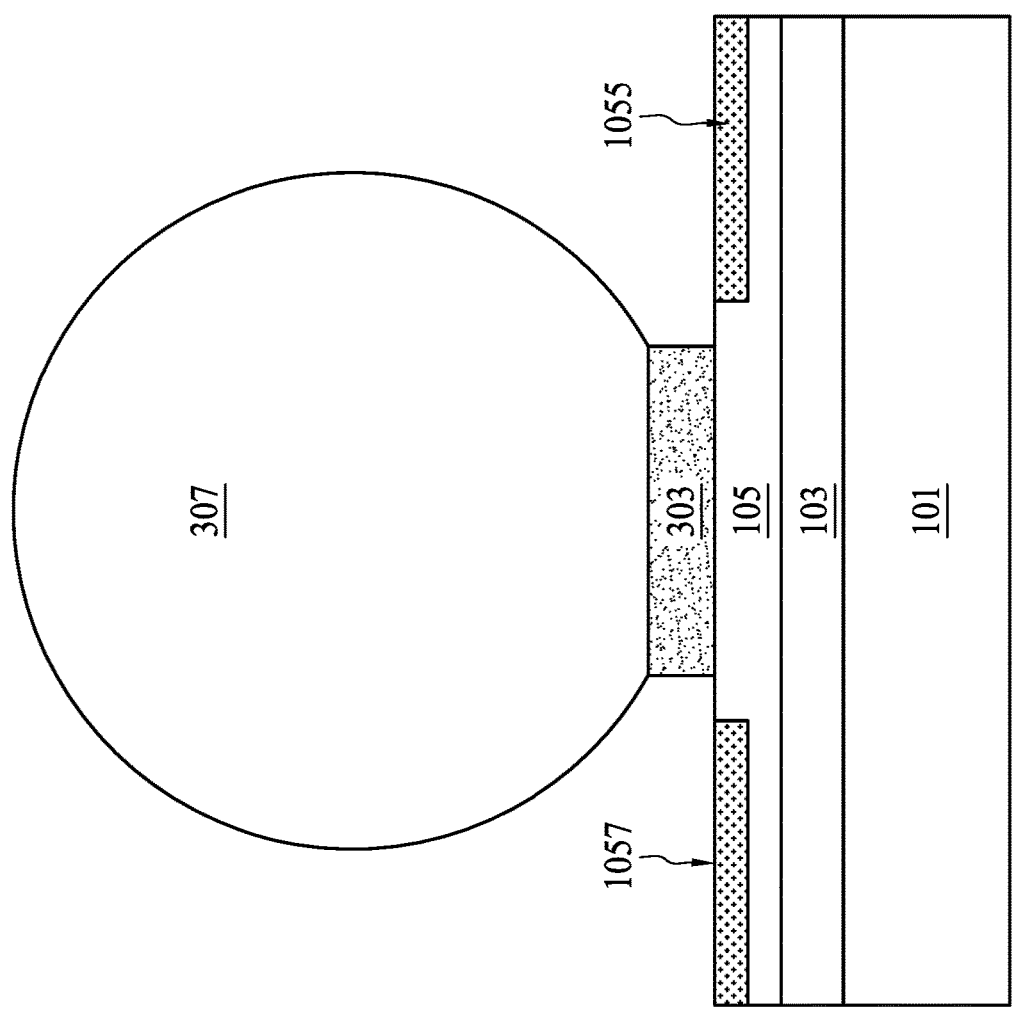
Figure 15:
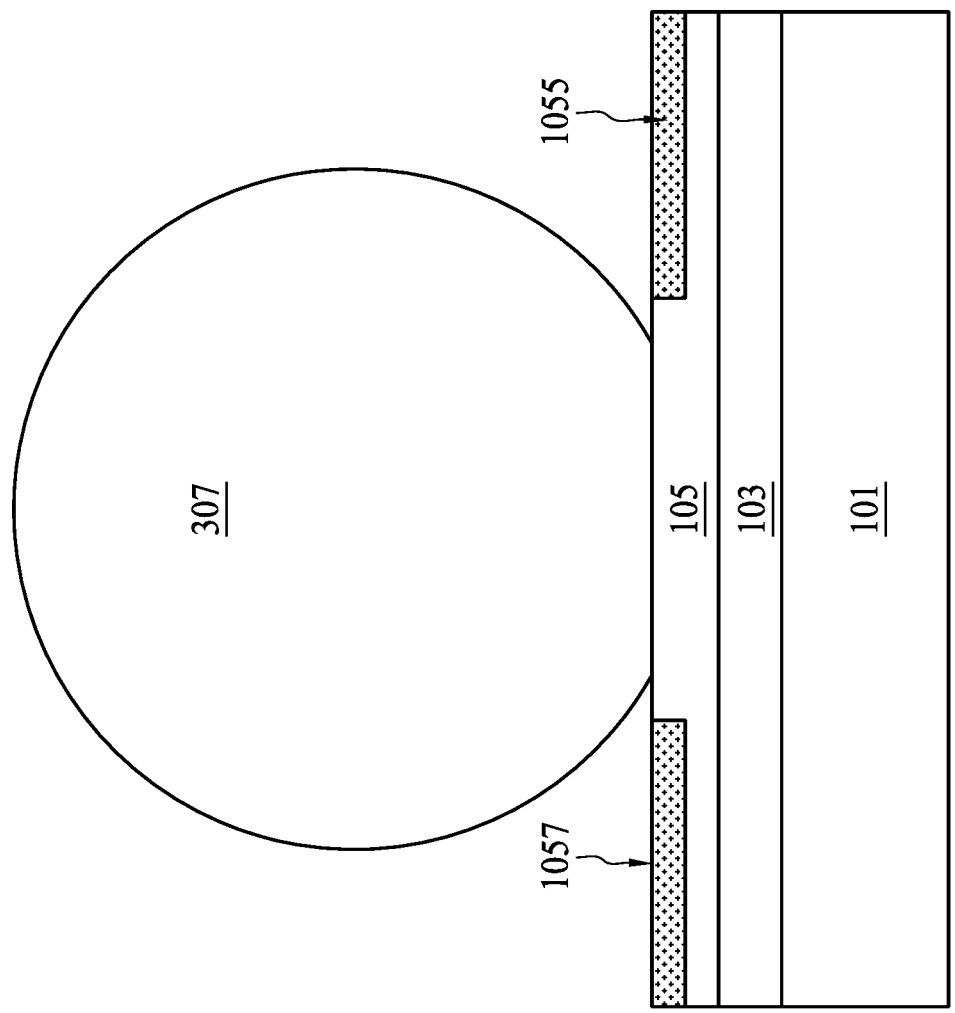

FIG. 14 shows a conductive structure 307 such as a solder ball being placed on the second flux layer 303 following the operations shown in FIG. 10 to FIG. 13. FIG. 15 shows a final structure after a reflow operation conducted on the semiconductor package structure in FIG. 14. In some embodiments the reflow operation includes heating the semiconductor package structure to a second temperature of from about 230 to about 270 degrees Celsius and keep at said temperature for 1.5 minutes. After the reflow operation is completed, the second flux layer 303 disappears and the conductive structure 307 is electrically connected to the PPI layer 105. In some embodiments, the second temperature is a solder reflow temperature ranging from about 230 to about 270 degrees Celsius. Compared to the first temperature discussed previously where in some embodiments, the first temperature of from about 130 to about 220 degrees Celsius is applied to facilitate the oxidation operation and causing the first flux layer 302 to soften.

Figure 16:
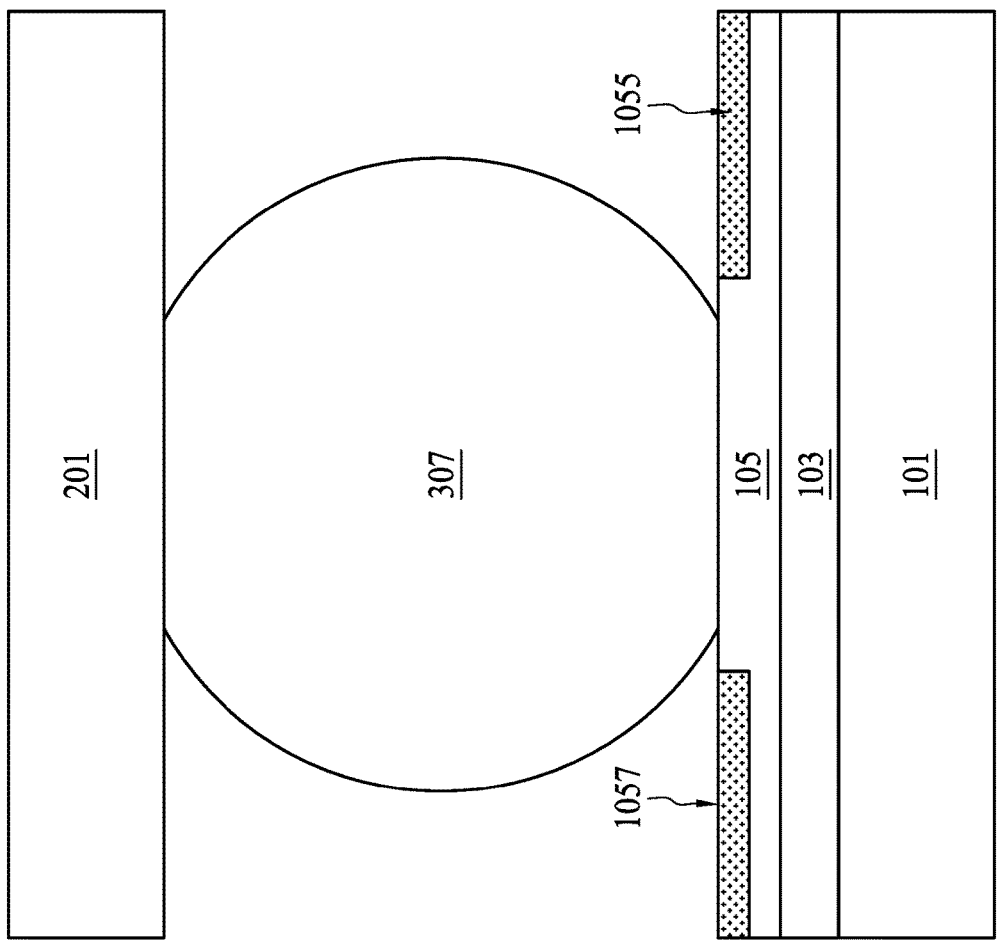

FIG. 16 shows a semiconductor package including a semiconductor package structure 100 as shown in FIG. 1 and an external device 201 electrically connected to the stack (101, 103, 105) via the conductive structure 307. The semiconductor package shown in FIG. 16 includes performing another reflow operation to form an electrical connection between the external device 201 and the conductive structure 307. In some embodiments, the reflow operation includes heating the semiconductor package to a second temperature of from about 230 to about 270 degrees Celsius and keep at said temperature for 1.5 minutes. In some embodiments, the external device 201 includes, but not limited to, a PCB board, a memory device, a CPU, or other devices possessing electrical I/O.

Some embodiments of the present disclosure provide a semiconductor package. The semiconductor package includes a substrate, a passivation layer over the substrate, a post-passivation interconnect (PPI) having a top surface, positioning over the passivation layer, and a conductive structure electrically connected to the PPI. The top surface of the PPI includes a first region receiving the conductive structure, and a second region surrounding the first region. The second region includes metal derivative transformed from materials made of the first region.

In some embodiments of the present disclosure, the metal derivative of the second region of the semiconductor package includes metal oxides or metal nitrides.

In some embodiments of the present disclosure, the PPI of the semiconductor package include a power line, a redistribution line, an inductor, a capacitor, or passive components.

In some embodiments of the present disclosure, the PPI of the semiconductor package includes conductive materials, and wherein the metal derivative of the second region comprises conductive material oxides.

In some embodiments of the present disclosure, the conductive structure includes a solder bump.

In some embodiments of the present disclosure, the semiconductor package further comprising an external device electrically connected to the conductive structure.

Some embodiments of the present disclosure provide a semiconductor package. The semiconductor package includes a substrate, a passivation layer over the substrate, a post-passivation interconnect (PPI) having a top surface, positioning over the passivation layer; and a conductive structure electrically connected to the PPI. The top surface of the PPI includes a first region electrically connected to the conductive structure, and a second region surrounding the first region. The second region includes metal derivative with a thickness greater than about 1 mun, and the conductive structure is unwetting on the second region.

In some embodiments of the present disclosure, the metal derivative of the semiconductor package includes oxides or nitrides.

In some embodiments of the present disclosure, the PPI of the semiconductor package include a power line, a redistribution line, an inductor, a capacitor, or passive components.

In some embodiments of the present disclosure, the PPI of the semiconductor package includes conductive materials, and wherein the metal derivative of the second region comprises conductive material oxides.

In some embodiments of the present disclosure, the conductive structure includes a solder bump.

In some embodiments of the present disclosure, the semiconductor package further comprising an external device electrically connected to the conductive structure.

Some embodiments of the present disclosure provide a method of manufacturing a semiconductor package. The method includes patterning a metal derivative in a second region of a post-passivation interconnect (PPI); forming a flux layer in a first region of the PPI, wherein the first region is surrounded by the second region; dropping a solder ball on the flux layer; and forming electrical connection between the solder ball and the PPI.

In some embodiments of the present disclosure, the patterning the metal derivative in the second region of the PPI of the method of manufacturing a semiconductor package further includes forming a mask layer over the PPI.

In some embodiments of the present disclosure, the forming the mask layer over the PPI of the method of manufacturing a semiconductor package further includes positioning a first stencil plate over the PPI.

In some embodiments of the present disclosure, the patterning the metal derivative in the second region of the PPI of the method of manufacturing a semiconductor package includes an oxygen plasma surface treatment.

In some embodiments of the present disclosure, the forming the flux layer in the first region of the PPI of the method of manufacturing a semiconductor package includes positioning a second stencil plate over the PPI.

In some embodiments of the present disclosure, the forming the mask layer over the PPI of the method of manufacturing a semiconductor package further includes forming a mask layer on the PPI.

In some embodiments of the present disclosure, the forming electrical connection between the solder ball and the PPI of the method of manufacturing a semiconductor package includes a reflow operation.

Some embodiments of the present disclosure provide a method of manufacturing a semiconductor package. The method includes forming a first flux layer covering a portion of a top surface of a post-passivation interconnect (PPI); transforming a portion of the top surface of the PPI uncovered by the first flux layer into a metal derivative layer, removing the first flux layer thereby exposing a first region of the PPkI forming a second flux layer on the first region of the PPI; dropping a solder ball on the flux layer; and forming electrical connection between the solder ball and the PPI.

In some embodiments of the present disclosure, the forming the first flux layer covering a portion of a top surface of the PPI of the method of manufacturing a semiconductor package includes positioning a first stencil plate over the PPI.

In some embodiments of the present disclosure, the transforming a portion of the top surface of the PPI uncovered by the first flux layer into the metal derivative layer of the method of manufacturing a semiconductor package includes heating the semiconductor package to a first temperature.

In some embodiments of the present disclosure, the forming electrical connection between the solder ball and the PPI of the method of manufacturing a semiconductor package includes heating the semiconductor package to a second temperature, and wherein the second temperature is higher than the first temperature.

In some embodiments of the present disclosure, an area of the portion of the top surface of the PPI covered by the first flux layer before transforming the portion of the top surface of the PPI uncovered by the first flux layer into a metal derivative layer is smaller than an area of the first region.

In some embodiments of the present disclosure, the transforming a portion of the top surface of the PPI uncovered by the first flux layer into the metal derivative layer of the method of manufacturing a semiconductor package includes flowing oxygen into a chamber accommodating the semiconductor package.

In some embodiments of the present disclosure, the transforming a portion of the top surface of the PPI uncovered by the first flux layer into the metal derivative layer of the PPI of the method of manufacturing a semiconductor package includes an oxygen plasma surface treatment.

In some embodiments of the present disclosure, the forming the second flux layer on the first region of the PPI of the method of manufacturing a semiconductor package includes positioning a second stencil plate over the PPI.

Although the present invention and its advantages have been described in detail, it should be understood that various changes, substitutions and alterations cancan be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor package, comprising:
    patterning a first region and a second region on a post-passivation interconnect (PPI), the second region being an oxide or a nitride derivative of the first region; and
    annealing the first region and the second region on the PPI with a first temperature heat treatment;
    wherein the first region is surrounded by the second region.

2. The method of manufacturing a semiconductor package in claim 1, wherein the patterning the first region and the second region on the PPI further comprises forming a mask layer over the PPI.

3. The method of manufacturing a semiconductor package in claim 2, wherein the forming the mask layer over the PPI comprises forming a mask layer in contact with the PPI.

4. The method of manufacturing a semiconductor package in claim 2, wherein the forming the mask layer over the PPI comprises positioning a first stencil plate over the PPI.

5. The method of manufacturing a semiconductor package in claim 4, further comprising forming a flux layer in the first region of the PPI by positioning a second stencil plate over the PPI.

6. The method of manufacturing a semiconductor package in claim 5, further comprising:
dropping a solder ball on the flux layer; and
reflowing the solder ball to form a solder bump.

7. The method of manufacturing a semiconductor package in claim 6, further comprising forming an electrical connection between an external device and the solder bump.

8. The method of manufacturing a semiconductor package in claim 1, wherein the patterning the first region and the second region of the PPI comprises an oxygen plasma surface treatment.

9. A method of manufacturing a semiconductor package, comprising:
patterning a metal derivative in a second region of a post-passivation interconnect (PPI) by covering a first region of the PPI with a photoresist;
dropping a solder ball on the first region; and
forming an electrical connection between the solder ball and the PPI.

10. The method of manufacturing a semiconductor package in claim 9, wherein the first region is surrounded by the second region.

11. The method of manufacturing a semiconductor package in claim 9, wherein the patterning the metal derivative comprises applying a stencil plate over but free of contact with the PPI.

12. The method of manufacturing a semiconductor package in claim 9, further comprising forming a flux layer on the first region of the PPI.

13. The method of manufacturing a semiconductor package in claim 12, wherein the forming the flux layer comprises a screen printing operation or a photolithography operation.

14. The method of manufacturing a semiconductor package in claim 12, wherein a width of the flux layer as formed is narrower than a width of the first region.

15. A method of manufacturing a semiconductor package, comprising:
patterning a metal derivative having a thickness of from about 1 μm to about 3 μm in a second region of a post-passivation interconnect (PPI), the metal derivative comprising metal oxide or metal nitride; and
disposing a solder ball on a first region of the PPI, wherein the first region is surrounded by the second region.

16. The method of manufacturing a semiconductor package in claim 15, further comprising annealing the PPI with a first temperature heat treatment from about 100 to about 250 degrees Celsius.

17. The method of manufacturing a semiconductor package in claim 16, wherein the patterning the metal derivative comprises applying an oxygen plasma surface treatment.

18. The method of manufacturing a semiconductor package in claim 17, wherein the annealing the PPI is performed concurrently with applying the oxygen plasma surface treatment.

19. The method of manufacturing a semiconductor package in claim 15, further comprising forming a flux layer in the first region of the PPI.

20. The method of manufacturing a semiconductor package in claim 19, wherein annealing the PPI with is performed concurrently with forming the flux layer in the first region of the PPI.

* * * * *